(12) United States Patent  
Marutani et al.

(10) Patent No.: US 10,083,943 B2  
(45) Date of Patent: Sep. 25, 2018

(54) LIGHT-EMITTING DEVICE AND METHOD OF MANUFACTURING THE SAME

(71) Applicant: NICHIA CORPORATION, Anan-shi, Tokushima (JP)

(72) Inventors: Yukitoshi Marutani, Anan (JP); Hiroto Tamaki, Anan (JP); Tadaaki Miyata, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/623,211

(22) Filed: Jun. 14, 2017

(65) Prior Publication Data

US 2017/0287883 A1    Oct. 5, 2017

Related U.S. Application Data

(60) Division of application No. 14/928,009, filed on Oct. 30, 2015, now Pat. No. 9,711,491, which is a (Continued)

(30) Foreign Application Priority Data

Aug. 31, 2012  (JP) .................................. 2012-192454  
Sep. 20, 2012  (JP) .................................. 2012-206898  
Jun. 25, 2013  (JP) .................................. 2013-132161

(51) Int. Cl.  
*H01L 33/50*  (2010.01)  
*H01L 25/075*  (2006.01)  
(Continued)

(52) U.S. Cl.  
CPC .......... *H01L 25/0753* (2013.01); *H01L 33/50* (2013.01); *H01L 33/60* (2013.01); (Continued)

(58) Field of Classification Search  
CPC ..... H01L 25/0753; H01L 33/60; H01L 33/62; H01L 33/50; H01L 2224/16; F21Y 2115/10; F21Y 2103/10; F21K 9/27  
See application file for complete search history.

(56) References Cited

U.S. PATENT DOCUMENTS

2005/0057939 A1    3/2005  Mizuyoshi  
2006/0138436 A1    6/2006  Chen et al.  
(Continued)

FOREIGN PATENT DOCUMENTS

JP    H05-016400 U    3/1993  
JP    J05-072978 A    3/1993  
(Continued)

*Primary Examiner* — Jessica Manno  
*Assistant Examiner* — Mohammed R Alam  
(74) *Attorney, Agent, or Firm* — Foley & Lardner LLP

(57) ABSTRACT

A method of manufacturing a light-emitting device includes steps of: preparing at least one substrate having a plurality of through holes; providing an electric wire on a rear surface side of the substrate so that a plurality of portions of the electric wire communicates with a front surface side of the substrate at the plurality of through holes of the substrate; and respectively mounting a plurality of light-emitting diodes to the respective portions of the electric wire that communicate with the front surface side of the substrate.

7 Claims, 15 Drawing Sheets

Related U.S. Application Data continuation of application No. 14/015,171, filed on Aug. 30, 2013, now Pat. No. 9,190,587.

(51) Int. Cl.
*H01L 33/62* (2010.01)
*H01L 33/60* (2010.01)
*F21Y 103/10* (2016.01)
*F21K 9/27* (2016.01)
*F21Y 115/10* (2016.01)

(52) U.S. Cl.
CPC ............... *H01L 33/62* (2013.01); *F21K 9/27* (2016.08); *F21Y 2103/10* (2016.08); *F21Y 2115/10* (2016.08); *H01L 2224/16* (2013.01)

(56) References Cited

U.S. PATENT DOCUMENTS

| | | | |
|---|---|---|---|
| 2007/0252523 A1 | 11/2007 | Maeda et al. | |
| 2008/0200089 A1 | 8/2008 | Tsai | |
| 2008/0284308 A1 | 11/2008 | Pang | |
| 2009/0101921 A1 | 4/2009 | Lai | |
| 2009/0291518 A1 | 11/2009 | Kim et al. | |
| 2010/0117537 A1 | 5/2010 | Oy | |
| 2010/0157598 A1 | 6/2010 | Tsai | |
| 2010/0203657 A1* | 8/2010 | Kim | B29D 11/00278 438/23 |
| 2010/0226126 A1 | 9/2010 | Naito et al. | |
| 2011/0037091 A1* | 2/2011 | Fushimi | H01L 33/486 257/98 |
| 2011/0058372 A1 | 3/2011 | Lerman et al. | |
| 2011/0140135 A1 | 6/2011 | Lee et al. | |
| 2011/0284887 A1 | 11/2011 | Wu et al. | |
| 2011/0303936 A1 | 12/2011 | Wu | |
| 2012/0049222 A1 | 3/2012 | Yoshizumi et al. | |
| 2012/0193666 A1 | 8/2012 | Namiki et al. | |
| 2012/0325795 A1 | 12/2012 | Suzuki et al. | |
| 2013/0213697 A1* | 8/2013 | Palaniswamy | H01L 33/486 174/254 |

FOREIGN PATENT DOCUMENTS

| | | |
|---|---|---|
| JP | H05-025749 U | 4/1993 |
| JP | H05-134615 A | 5/1993 |
| JP | H06-302864 A | 10/1994 |
| JP | J10-208514 A | 8/1998 |
| JP | 3246927 B2 | 1/2002 |
| JP | 2002-134791 A | 5/2002 |
| JP | 2004-200537 | 7/2004 |
| JP | 2005-026303 A | 1/2005 |
| JP | 2005-063995 A | 3/2005 |
| JP | 2005-093594 | 4/2005 |
| JP | 2005-159260 | 6/2005 |
| JP | 2005-524783 A | 8/2005 |
| JP | 3138910 U | 12/2007 |
| JP | 2008-135387 | 6/2008 |
| JP | 2009-164337 A | 7/2009 |
| JP | 2009-528685 A | 8/2009 |
| JP | 2009-253169 A | 10/2009 |
| JP | 2009-535799 A | 10/2009 |
| JP | 2009-283942 | 12/2009 |
| JP | 2010-526400 A | 7/2010 |
| JP | 2010-212283 | 9/2010 |
| JP | 3167296 U | 3/2011 |
| JP | 2011-083794 | 4/2011 |
| JP | 2011-187752 A | 9/2011 |
| JP | 2012-049229 | 3/2012 |
| JP | 2012-059736 | 3/2012 |
| WO | WO-2008/129118 | 10/2008 |

\* cited by examiner

LIGHT-EMITTING DEVICE AND METHOD OF MANUFACTURING THE SAME

CROSS-REFERENCE TO RELATED APPLICATIONS

This application is a divisional of U.S. patent application Ser. No. 14/928,009, filed Oct. 30, 2015, which is a continuation of U.S. patent application Ser. No. 14/015,171, filed Aug. 30, 2013, now U.S. Pat. No. 9,190,587, and claims priority to and the benefit of Japanese Patent Application No. 2013-132161, filed on Jun. 25, 2013; Japanese Patent Application No. 2012-206898, filed on Sep. 20, 2012; and Japanese Patent Application No. 2012-192454, filed on Aug. 31, 2012, each of which is hereby incorporated by reference in their entireties.

BACKGROUND

Technical Field

The present disclosure relates to a light-emitting device and a method of manufacturing the light-emitting device.

Discussion of Related Art

Recently, light-emitting devices using light-emitting diodes such as LED lighting (for example, refer to "Description of Lighting Fixture Mounted with a Straight-Tube LED Lamp", [online], Feb. 28, 2010, Panasonic Corporation, [retrieved Aug. 5, 2012], Internet <URL: http://www.hkd.meti.go.jp/hokne/h22enematch/2data05.pdf) are becoming widely popular.

However, since light-emitting devices using light-emitting diodes are still very expensive compared to conventional light-emitting devices such as an incandescent bulb or a fluorescent lamp, a further reduction in prices must be achieved in order to promote popularization of such light-emitting devices.

SUMMARY

In one embodiment of the present invention, a light-emitting device may comprise at least one substrate, at least one electric wire fixed to the substrate, and a plurality of light-emitting diodes mounted to the electric wire. Each of the plurality of light-emitting diodes is an LED chip. The light-emitting diodes on the substrate are sealed individually or collectively by one or more sealing members.

According to another embodiment of the present invention, a light-emitting device may comprise: at least one substrate having a plurality of through holes; at least one electric wire provided on a rear surface side of the substrate; and a plurality of light-emitting diodes. A plurality of portions of the electric wire provided on the rear surface side of the substrate communicates with a front surface side of the substrate at the plurality of through holes of the substrate. The plurality of light-emitting diodes is respectively mounted to the respective portions of the electric wire that communicate with the front surface side of the substrate.

According to another embodiment of the present invention, a method of manufacturing a light-emitting device, may comprise the steps of: preparing at least one substrate having a plurality of through holes; providing an electric wire on a rear surface side of the substrate so that a plurality of portions of the electric wire communicates with a front surface side of the substrate at the plurality of through holes of the substrate; and respectively mounting a plurality of light-emitting diodes to the respective portions of the electric wire that communicate with the front surface side of the substrate.

BRIEF DESCRIPTION OF THE DRAWINGS

FIGS. 1A-1C are schematic configuration diagrams of a light-emitting device according to a first embodiment, in which FIG. 1A is a perspective view, FIG. 1B is a partially enlarged view which shows an enlargement of a portion denoted by A in FIG. 1A, and FIG. 1C is a diagram partially showing a cross section taken along B-B in FIG. 1B.

FIGS. 2A-2C are schematic configuration diagrams of a light-emitting device according to a second embodiment, in which FIG. 2A is a perspective view, FIG. 2B is a partially enlarged view which shows an enlargement of a portion denoted by A in FIG. 2A, and FIG. 2C is a diagram showing a cross section taken along B-B in FIG. 2B.

FIGS. 3A-3C are schematic configuration diagrams of a light-emitting device according to a third embodiment, in which FIG. 3A is a perspective view, FIG. 3B is a partially enlarged view which shows an enlargement of a portion denoted by A in FIG. 3A, and FIG. 3C is a diagram showing a cross section taken along B-B in FIG. 3B.

FIGS. 6A-6C are diagrams showing a schematic configuration of a light-emitting device according to a sixth embodiment, in which FIG. 6A is a perspective view, FIG. 6B is a partially enlarged view which shows an enlargement of a portion denoted by A in FIG. 6A, and FIG. 6C is a diagram showing a cross section taken along B-B in FIG. 6B.

FIGS. 7A-7C are diagrams showing a schematic configuration of a light-emitting device according to a seventh embodiment, in which FIG. 7A is a perspective view, FIG. 7B is a partially enlarged view which shows an enlargement of a portion denoted by A in FIG. 7A, and FIG. 7C is a diagram showing a cross section taken along B-B in FIG. 7B.

DETAILED DESCRIPTION

Hereinafter, embodiments will be described with reference to the accompanying drawings.

[Light-Emitting Device According to a First Embodiment]

Figure 1A:
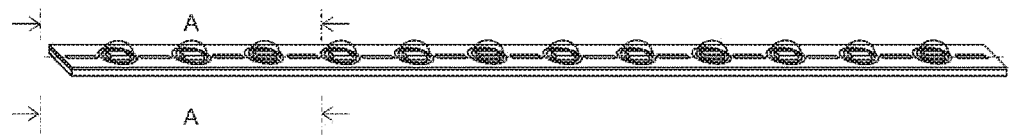
Figure 1B:
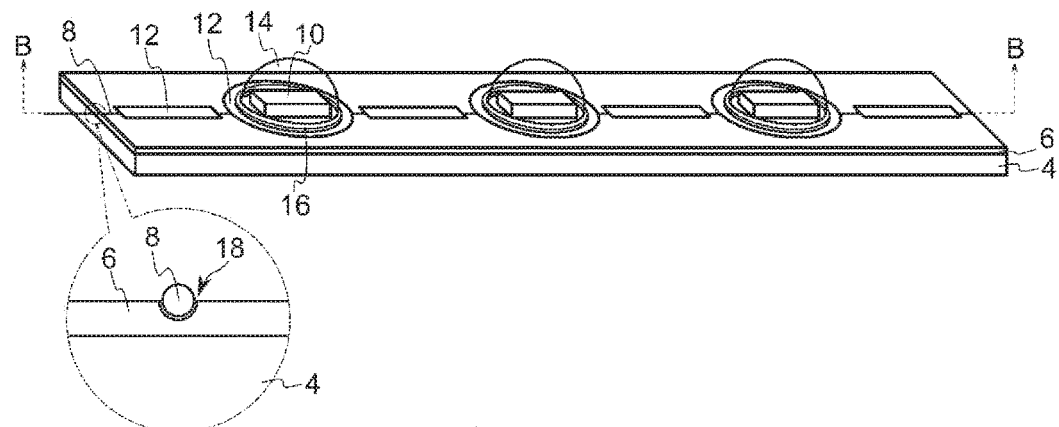
Figure 1C:
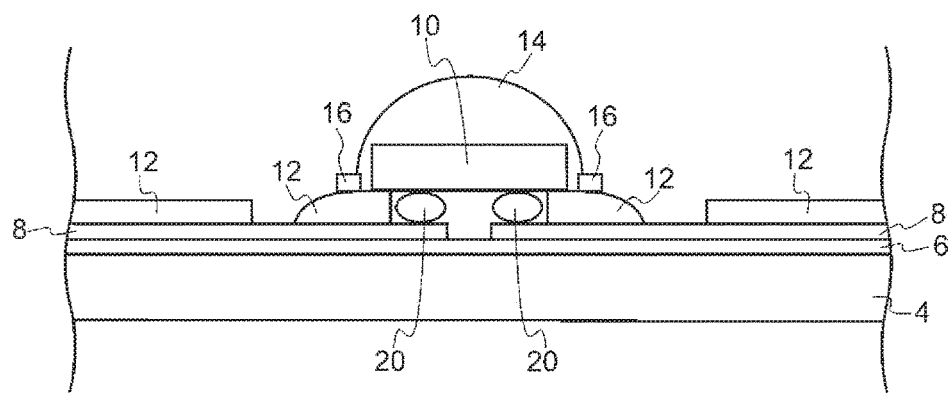

FIGS. 1A-1C are schematic configuration diagrams of a light-emitting device according to a first embodiment, in which FIG. 1A is a perspective view, FIG. 1B is a partially enlarged view which shows an enlargement of a portion denoted by A in FIG. 1A, and FIG. 1C is a diagram partially showing a cross section taken along B-B in FIG. 1B.

As shown in FIGS. 1A-1C, the light-emitting device according to the first embodiment comprises a substrate 4, a plurality of electric wires 8 fixed at predetermined intervals to the substrate 4 using adhesives 12, and a plurality of light-emitting diodes 10 mounted to the electric wires 8 so that the plurality of electric wires 8 form a single line. With the light-emitting device according to the first embodiment, a light-emitting device in which the plurality of light-emitting diodes 10 are connected in series can be inexpensively provided by a simple configuration using the substrate 4 and the electric wires 8. Fixing using the adhesive 12 is an example of means for fixing the electric wire 8.

[Light-Emitting Device According to a Second Embodiment]

Figure 2A:
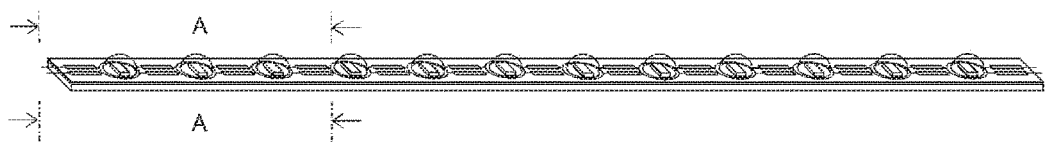
Figure 2B:
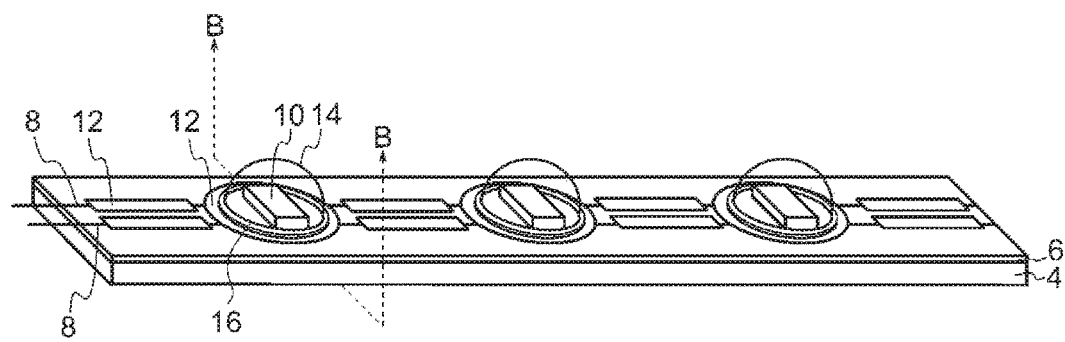
Figure 2C:
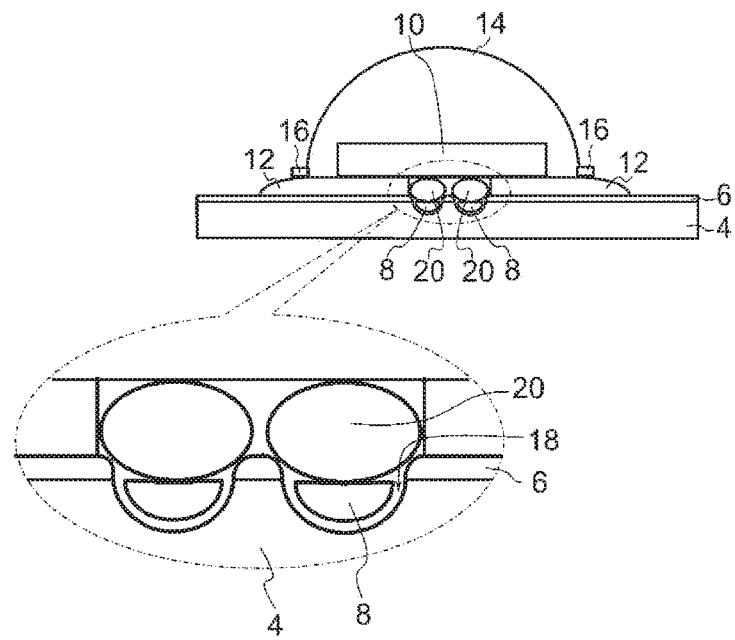

FIGS. 2A-2C are schematic configuration diagrams of a light-emitting device according to a second embodiment, in which FIG. 2A is a perspective view, FIG. 2B is a partially enlarged view which shows an enlargement of a portion denoted by A in FIG. 2A, and FIG. 2C is a diagram showing a cross section taken along B-B in FIG. 2B.

As shown in FIGS. 2A-2C, the light-emitting device according to the second embodiment comprises a substrate 4, two electric wires 8 fixed to the substrate 4 using adhesives 12, and a plurality of light-emitting diodes 10 mounted to the electric wires 8 so that respective positive and negative electrodes of the light-emitting diodes 10 are joined to the two electric wires 8. With the light-emitting device according to the second embodiment, a light-emitting device in which the plurality of light-emitting diodes 10 are connected in parallel can be inexpensively provided by a simple configuration using the substrate 4 and the electric wires 8. Fixing using the adhesive 12 is an example of means for fixing the electric wire 8.

[Light-Emitting Device According to a Third Embodiment]

Figure 3A:
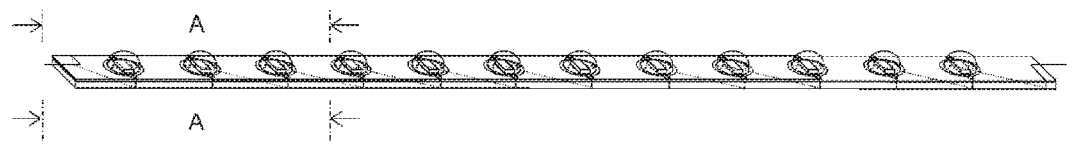
Figure 3B:
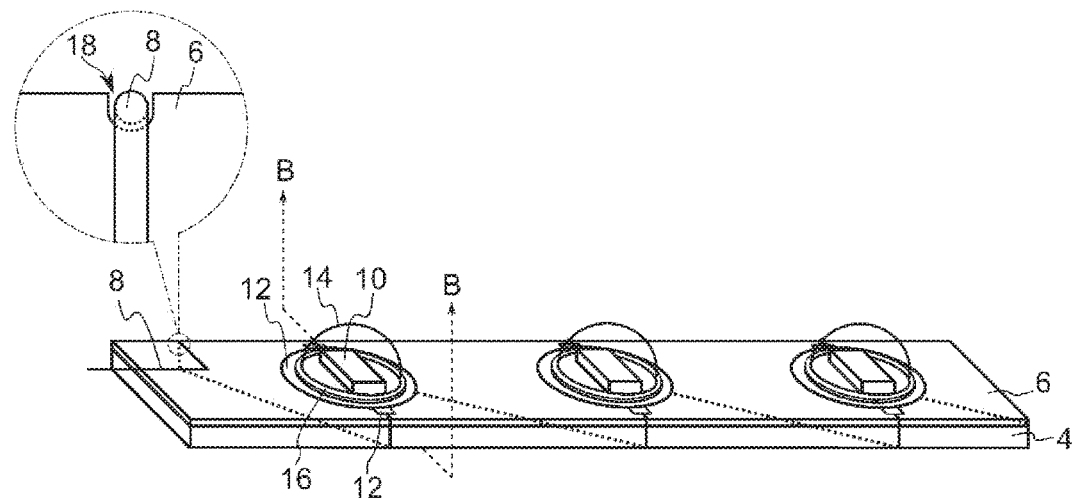
Figure 3C:
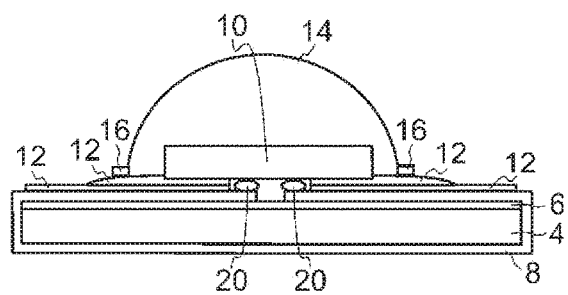

FIGS. 3A-3C are diagrams showing a schematic configuration of a light-emitting device according to a third embodiment, in which FIG. 3A is a perspective view, FIG. 3B is a partially enlarged view which shows an enlargement of a portion denoted by A in FIG. 3A, and FIG. 3C is a diagram showing a cross section taken along B-B in FIG. 3B.

As shown in FIGS. 3A-3C, the light-emitting device according to the third embodiment comprises a substrate 4, a single electric wire 8 fixed to the substrate 4 by winding, and a plurality of light-emitting diodes 10 mounted to the single electric wire 8. With the light-emitting device according to the third embodiment, a light-emitting device in which the plurality of light-emitting diodes 10 are connected in series can be inexpensively provided by a simple configuration using the substrate 4 and the electric wire 8. Fixing by winding is an example of means for fixing the electric wire 8. The electric wire 8 can be bonded to the substrate 4 (Specifically, an insulating layer 6) using adhesives 12 after being fixed to the substrate 4 by winding.

[Light-Emitting Device According to a Fourth Embodiment]

Figure 4:
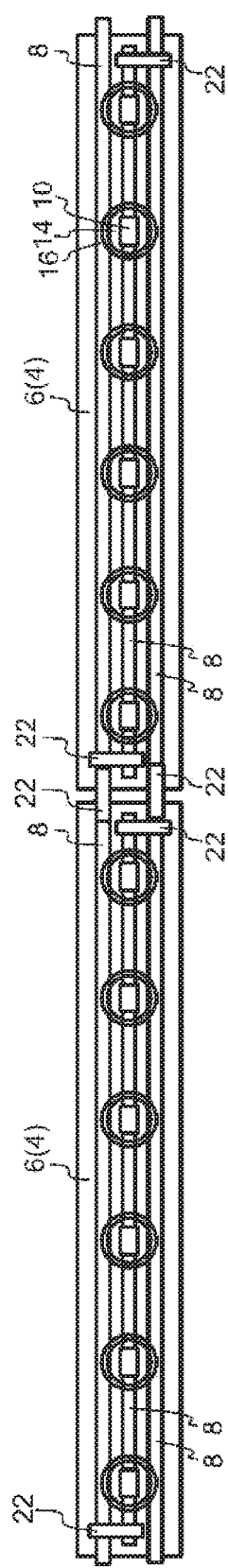
FIG. 4 is a schematic plan diagram of a light-emitting device according to a fourth embodiment.

FIG. 4 is a schematic plan view of a light-emitting device according to a fourth embodiment.

As shown in FIG. 4, the light-emitting device according to the fourth embodiment comprises two substrates 4 (since insulating layers 6 (to be described later) are provided on surfaces of the substrates 4, the substrates 4 do not appear in FIG. 4), a plurality of electric wires 8 fixed to the substrates 4 using fixing tapes, short-circuit electric wires 22 which short-circuit the plurality of electric wires 8 so that a series-parallel circuit is formed, and a plurality of light-emitting diodes 10 mounted to the plurality of electric wires 8. With the light-emitting device according to the fourth embodiment, a light-emitting device in which the plurality of light-emitting diodes 10 are connected in series-parallel can be inexpensively provided by a simple configuration using the substrates 4 and the electric wires 8. Fixing using the tape is an example of means for fixing the electric wire 8.

[Light-Emitting Device According to a Fifth Embodiment]

Figure 5:
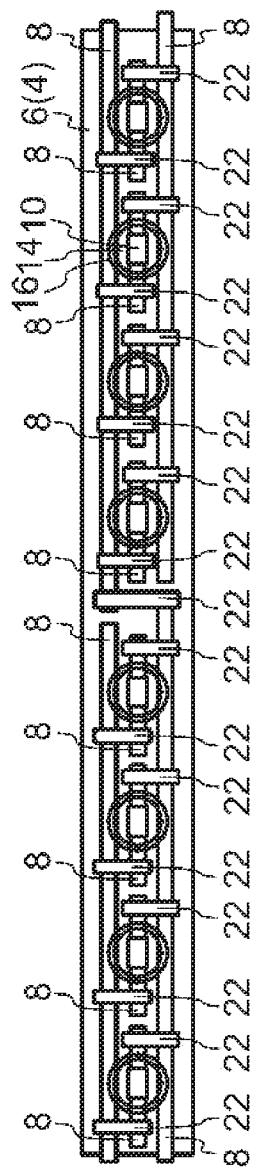
FIG. 5 is a schematic plan diagram of a light-emitting device according to a fifth embodiment.

FIG. 5 is a schematic plan view of a light-emitting device according to a fifth embodiment.

As shown in FIG. 5, the light-emitting device according to the fifth embodiment comprises a substrate 4 (since an insulating layer 6 (to be described later) is provided on a surface of the substrate 4, the substrate 4 does not appear in FIG. 5), a plurality of electric wires 8 fixed to the substrate 4 using adhesives, short-circuit electric wires 22 which short-circuit the plurality of electric wires 8 so that a parallel-series circuit is formed, and a plurality of light-emitting diodes 10 mounted to the plurality of electric wires 8. With the light-emitting device according to the fifth embodiment, a light-emitting device in which the plurality of light-emitting diodes 10 are connected in parallel-series can be inexpensively provided by a simple configuration using the substrate 4 and the electric wires 8. Fixing using the adhesive is an example of means for fixing the electric wire 8.

With the light-emitting devices according to the first to fifth embodiments, since the plurality of light-emitting diodes 10 can be energized by a simple configuration using relatively inexpensive members such as the at least one substrate 4 and the at least one electric wire 8 instead of relatively expensive members such as a printed circuit board and a lead frame, light-emitting devices which use the light-emitting diodes 10 and which are less expensive than conventional light-emitting devices can be provided.

[Light-Emitting Device According to a Sixth Embodiment]

Figure 6A:
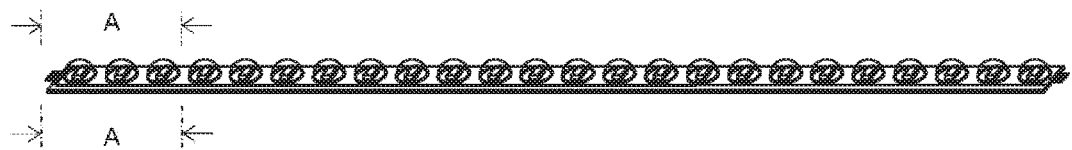
Figure 6B:
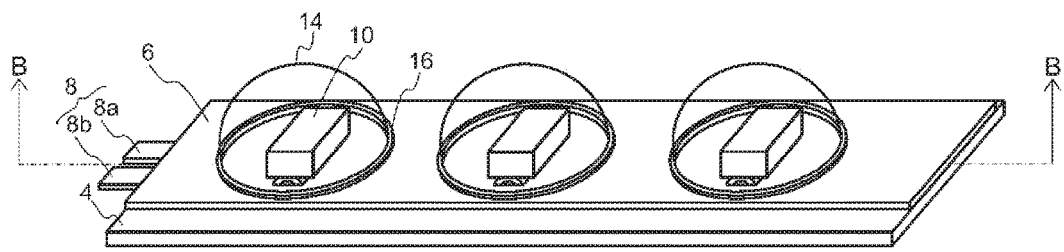
Figure 6C:
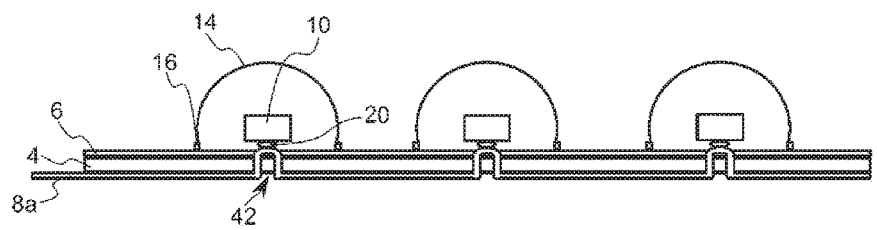

FIGS. 6A-6C are diagrams showing a schematic configuration of a light-emitting device according to a sixth embodiment, in which FIG. 6A is a perspective view, FIG. 6B is a partially enlarged view which shows an enlargement of a portion denoted by A in FIG. 6A, and FIG. 6C is a diagram showing a cross section taken along B-B in FIG. 6B.

As shown in FIGS. 6A-6C, the light-emitting device according to the sixth embodiment comprises a substrate 4 having a plurality of through holes 42, a pair of electric wires 8 provided on a rear surface side of the substrate 4, and a plurality of light-emitting diodes 10.

In this embodiment, the pair of electric wires 8 is constituted by a pair of an anode electric wire 8a and a cathode electric wire 8b. In addition, with the anode electric wire 8a and the cathode electric wire 8b, respective portions to which the plurality of light-emitting diodes 10 are mounted are bent so as to project to a front surface side of the substrate 4 from a rear surface side of the substrate 4 through the through holes 42 and then again pass through the through holes 42 to return to the rear surface side of the substrate 4. The plurality of light-emitting diodes 10 are provided on the front surface side of the substrate 4 and positive and negative electrodes of the plurality of light-emitting diodes 10 are respectively connected to the anode electric wire 8*a* and the cathode electric wire 8*b*.

Therefore, with the light-emitting device according to the sixth embodiment, a plurality of portions of the electric wires 8 provided on the rear surface side of the substrate 4 communicates to the front surface side of the substrate 4 at the plurality of through holes 42 provided in the substrate 4, and the plurality of light-emitting diodes 10 provided on the front surface side of the substrate 4 are respectively mounted to the respective portions of the electric wires 8 which communicate to the front surface side of the substrate 4.

With the light-emitting device according to the sixth embodiment, since the plurality of light-emitting diodes 10 can be energized without having to use a printed circuit board or a lead frame which is considered to be one of the reasons why conventional light-emitting devices are expensive, light-emitting devices which use the light-emitting diodes 10 and which are less expensive than conventional light-emitting devices can be provided. Therefore, various forms of lighting including general lighting fixtures can be realized in an inexpensive and highly efficient manner.

In addition, with the light-emitting device according to the sixth embodiment, since the electric wires 8 are provided on the rear surface side of the substrate 4, freedom of wiring and arrangement of wires increases. Therefore, complicated circuits for individually driving the plurality of light-emitting diodes 10 or driving the plurality of light-emitting diodes 10 in arbitrary groups can be readily formed. Thus, the functionality of the light-emitting device can be enhanced in an inexpensive manner.

[Light-Emitting Device According to a Seventh Embodiment]

Figure 7A:
Figure 7B:
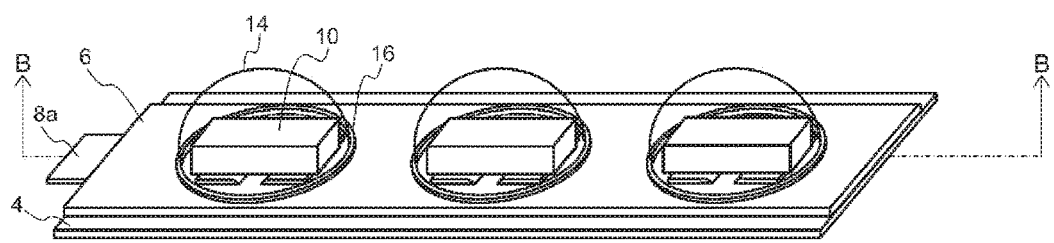
Figure 7C:
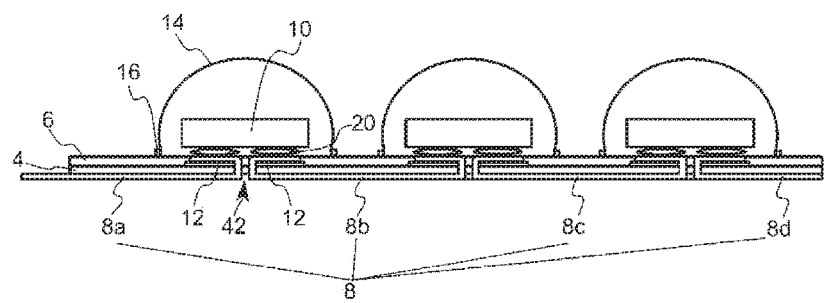

FIGS. 7A-7C are diagrams showing a schematic configuration of a light-emitting device according to a seventh embodiment, in which FIG. 7A is a perspective view, FIG. 7B is a partially enlarged view which shows an enlargement of a portion denoted by A in FIG. 7A, and FIG. 7C is a diagram showing a cross section taken along B-B in FIG. 7B.

As shown in FIGS. 7A-7C, in the light-emitting device according to the seventh embodiment, at least one electric wire 8 comprises a plurality of electric wires (an electric wire 8*a*, an electric wire 8*b*, an electric wire 8*c*, an electric wire 8*d*, . . . ). Each electric wire 8 (the electric wire 8*a*, the electric wire 8*b*, the electric wire 8*c*, the electric wire 8*d*, . . . ) has one end and another end respectively which project to a front surface side of the substrate 4 from a rear surface side of the substrate 4 through the through holes 42 and which are folded toward the front surface side of the substrate 4. A plurality of light-emitting diodes 10 are provided on the front surface side of the substrate 4 and positive and negative electrodes of the plurality of light-emitting diodes 10 are respectively connected to one end of one electric wire (for example, an electric wire 8*a*) among the plurality of electric wires 8 and another end of another electric wire (for example, an electric wire 8*b*) among the plurality of electric wires 8.

In a similar manner to the light-emitting device according to the sixth embodiment, with the light-emitting device according to the seventh embodiment, a plurality of portions of the electric wires 8 provided on the rear surface side of the substrate 4 communicate to the front surface side of the substrate 4 at the plurality of through holes 42 provided in the substrate 4, and the plurality of light-emitting diodes 10 provided on the front surface side of the substrate 4 are respectively mounted to the respective portions of the electric wires 8 which communicate to the front surface side of the substrate 4.

While the plurality of light-emitting diodes 10 can be connected in parallel with the light-emitting device according to the sixth embodiment, the plurality of light-emitting diodes 10 can be connected in series with the light-emitting device according to the seventh embodiment. By combining light-emitting devices according to the sixth and seventh embodiments, the plurality of light-emitting diodes 10 can be connected in series-parallel, parallel-series, and the like.

[Light-Emitting Device According to an Eighth Embodiment]

Figure 8A:
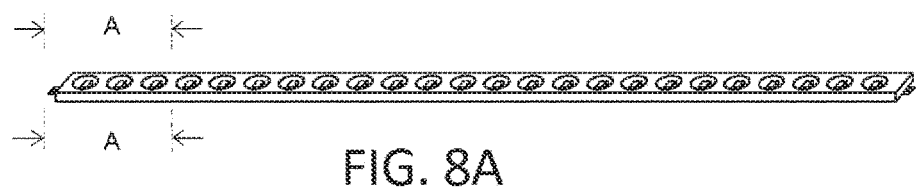
FIGS. 8A-8C are diagrams showing a schematic configuration of a light-emitting device according to an eighth embodiment.
Figure 8B:
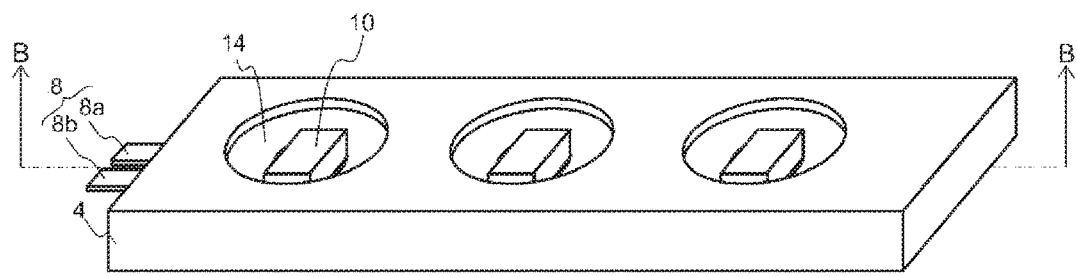
Figure 8C:
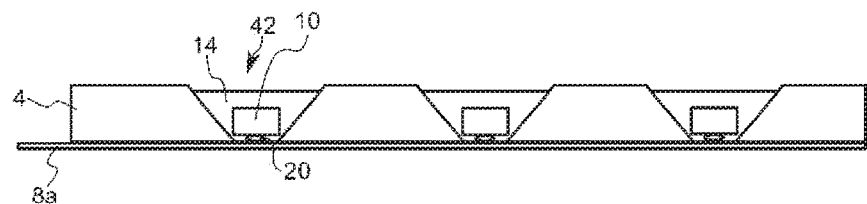

FIGS. 8A-8C are diagrams showing a schematic configuration of a light-emitting device according to an eighth embodiment, in which FIG. 8A is a perspective view, FIG. 8B is a partially enlarged view which shows an enlargement of a portion denoted by A in FIG. 8A, and FIG. 8C is a diagram showing a cross section taken along B-B in FIG. 8B.

As shown in FIGS. 8A-8C, in the light-emitting device according to the eighth embodiment, at least one electric wire 8 comprises an anode electric wire 8*a* and a cathode electric wire 8*b*. The anode electric wire 8*a* and the cathode electric wire 8*b* traverse opening planes of through holes 42 on a rear surface side of the substrate 4. A plurality of light-emitting diodes 10 are provided in the through holes 42, and positive and negative electrodes of the plurality of light-emitting diodes 10 are respectively connected to the anode electric wire 8*a* and the cathode electric wire 8*b*.

In a similar manner to the light-emitting device according to the sixth embodiment, with the light-emitting device according to the eighth embodiment, a plurality of portions of the electric wires 8 provided on the rear surface side of the substrate 4 communicate to the front surface side of the substrate 4 at the plurality of through holes 42 provided in the substrate 4, and the plurality of light-emitting diodes 10 provided on the front surface side of the substrate 4 are respectively mounted to the respective portions of the electric wires 8 which communicate to the front surface side of the substrate 4.

With the light-emitting devices according to the sixth to eighth embodiments described above, a resist, an etching material, a resist stripper, a plating solution, and respective recovery units thereof (refer to an additive method, a subtractive method, or the like) which are considered necessary for manufacturing a printed wiring board become unnecessary and the need for a tie-bar section and the like which are considered necessary for a light-emitting device using a lead frame is also eliminated. Thus, the waste that is conventionally produced when manufacturing a light-emitting device can now be reduced and an environmentally-friendly light-emitting device can be manufactured.

With the light-emitting devices according to the sixth to eighth embodiments described above, a light-emitting diode from the plurality of light-emitting diodes 10, a protective element such as a Zener diode, a connector, a combination thereof and the like can be mounted to the electric wires 8 on the rear surface side of the substrate 4. Accordingly, since the irregularities of the front surface side of the substrate 4 are reduced, the insulating layer 6 can be made thinner, the cost of the insulating layer 6 can be reduced, and a wider light distribution angle can be realized.

Hereinafter, the respective members of the present discloser will be described.

[Substrate 4]

As the substrate 4, for example, members with a plate shape, a sheet shape (a tape shape or a film shape), a rod shape, a pipe shape, a wire shape, or the like made of aluminum, copper, iron, an alloy thereof, or other materials (including glass, wood, and plastic) can be used. Examples of a shape of the substrate 4 in plan view include a reed shape, a rectangular shape, a polygonal shape, a circular shape, a fan shape, and a donut shape.

As described earlier, since a printed circuit board need not be used as the substrate 4 in the embodiments, a light-emitting device which uses the light-emitting diodes 10 and which is less expensive than conventional light-emitting devices can be provided.

A printed circuit board having one or more curve such as a circular shaped circuit board is fabricated by cutting the shaped circuit board out from a square printed circuit board or the like, and a considerable amount of waste is created during the cut. Therefore, a curved printed circuit board is more expensive than a square printed circuit board or the like. However, according to the embodiments, since inexpensive members made of aluminum, copper, iron, an alloy thereof, or other materials (including glass, wood, and plastic) can be used as the substrate 4, an inexpensive light-emitting device can be provided even if the substrate 4 has one or more curve to be shaped like a circular.

A size of the substrate 4 is not particularly limited and various sizes of the substrate 4 can be adopted in accordance with the intended use of the light-emitting device. For example, when the light-emitting device is used as a light source of a lighting device to replace a straight-tube fluorescent lamp, a rectangular member with a length of 30 mm to 50 mm in a short direction and a length of 300 mm to 1200 mm in a longitudinal direction can be used as the substrate 4.

Favorably, a member with flexibility (for example, a member with a film shape, a sheet shape, or the like) is used as the substrate 4. In this way, a light-emitting device can be manufactured by a roll-to-roll process, and a light-emitting device that is even more inexpensive can be provided. By bending the substrate 4, the substrate 4 can also be used in a circular fluorescent lamp.

For example, an insulating film with a thickness of 10 μm to 300 μm can be used as the member with flexibility. Examples of materials for the insulating film include resin films made of polyethylene terephthalate (PET), polyethylene naphthalate (PEN), polyetherimide (PEI), polyphenylene sulfide (PPS), liquid crystal polymer (LCP), and polyimide (PI). A light-emitting device that is even more inexpensive can be provided by using PET or PEN that is particularly inexpensive among these materials. In addition, the use of PI which has high heat resistance as the material of the insulating film enables the light-emitting diodes 10 to be mounted to the substrate 4 using solder material or the like. Thus, a light-emitting device that is even more inexpensive can be provided.

While the resin film can be transparent or colored, favorably, the resin film has enhanced optical reflectivity with respect to visible light such as a resin film containing an optically reflective material or a resin film subjected to a microcellular foaming process.

While conductive property, flexibility, transparency, and the like of the substrate 4 do not particularly matter, the substrate 4 favorably has low or no elasticity. In this way, after setting the electric wire 8 on the substrate 4, the adhesion between the substrate 4 and the electric wire 8 can be secured to prevent warping of the substrate 4 from occurring. In addition, the stress due to stretching or contraction of the substrate 4 can be prevented from acting on a portion of the electric wire 8 to which the light-emitting diode 10 is connected.

In one example of the substrate 4 with low elasticity, the elasticity of the substrate 4 is approximately equal to the elasticity of the electric wire 8. Examples where the elasticity of the substrate 4 is approximately equal to the elasticity of the electric wire 8 include a case where a copper thin plate is used as the substrate 4 and a copper wire is used as the electric wire 8 and a case where an aluminum plate is used as the substrate 4 and a copper-clad aluminum wire is used as the electric wire 8.

Favorably, a surface of the substrate 4 is coated with a metal with high optical reflectivity such as Ag or Al, a white resist made of a silicone resin containing titanium oxide, a metal-oxide composite film, or the like. In this way, luminous efficiency of the light-emitting device can be increased.

A groove 18 can be provided on the substrate 4 or the insulating layer 6 (to be described later). In this way, the electric wire 8 can be fitted in the groove 18 and kept in place. Therefore, the electric wire 8 can be fixed by being embedded in the substrate 4, and the manufacture can be simplified and a more inexpensive light-emitting device can be provided.

[Insulating Layer 6]

When the substrate 4 has conductive property, the insulating layer 6 is favorably provided on a surface on which the electric wire 8 is provided. While any film can be used as the insulating layer 6 as long as the film has insulating property, the insulating layer 6 favorably has high optical reflectivity. In this way, the light outputted from the light-emitting diode 10 can be efficiently reflected by the surface of the substrate 4. As the insulating layer 6 with high optical reflectivity, an insulating layer containing a white filler or a white powder can be used for example. More specifically, a silicone resin or a resist containing $TiO_2$, a white resist made of a silicone resin containing titanium oxide, a metal-oxide composite film such as an alumite, and the like can be used. In addition, favorably, the insulating layer 6 has high heat resistance and high light resistance. Members with shapes other than a film shape can be used as the insulating layer 6.

The insulating layer 6 can be provided across almost the entire area of a surface of the substrate 4 or provided in the limited areas surrounding the through holes 42.

[Electric Wire 8]

While various members having conductive property can be used as the electric wire 8, in particular, a member with superior conductive property is favorably used. For example, a metal wire with low electrical resistivity such as Cu, Au, Al, and Ag or a composite material thereof (a copper-clad aluminum wire, an alloy wire, or the like) can be favorably used. In addition, a member that is readily bent is favorable. Furthermore, a member that is less susceptible to damage (less susceptible to fatigue) even when bent is particularly favorable. A noble metal plating using Pd, Pt, Ag, or the like or tin-based plating can be applied to the electric wire 8. In particular, since Ag-plating produces high optical reflectivity, the brightness of the light-emitting device can be improved and is therefore favorable. For plating of the above, plating with good compatibility with connecting members that connect the positive and negative electrodes of the light-emitting diode 10 and the electric wire 8 to each other is favorably used. For example, when a solder material is used as the connecting member, an electric wire with noble metal plating or tin-based plating is favorably used as the electric wire 8.

As the electric wire 8, a coated electric wire in which a metal wire is coated by an insulating member can be used. In this case, the insulation coating on the insulation-coated electric wire that is exposed on the front surface side (or communicates with the front surface side) of the substrate 4 is removed by polishing or heat generated by an air heater, solder, or light to expose a core wire of the insulation-coated electric wire and to mount the light-emitting diode 10 to the exposed core wire. By using a coated electric wire, a plurality of electric wires 8 can be brought into contact with each other. Thus, various circuits can be assembled. A coated electric wire that uses an epoxy-based transparent resin containing a white resist or a white filler as an insulating/coating material can be favorably used as the electric wire 8 since the coating material has high reflectivity. As the coated electric wire, for example, magnet wires (an enameled wire, a rectangular copper wire, a streamlined wire, parallel wires, a copper-clad aluminum wire, or a fiber-covered or paper-covered copper winding wire) or the like can be used.

As the electric wire 8, a member created by covering a surface of a string that is an insulator with a conductor and further covering the conductor with an insulator can also be used. By using such a member as the electric wire 8, a plurality of electric wires 8 can be brought into contact with each other in a similar manner to using a coated electric wire. Therefore, various circuits can be assembled and a lightweight light-emitting device can be realized.

For example, a rectangular wire (a wire with a near-rectangular cross section) or a circular wire (a wire with a near-circular cross section) can be used as the electric wire 8. The use of a rectangular wire enables a wider joining area to be secured between the substrate 4 and the light-emitting diode 10. When using a circular wire, by partially flattening respective portions of the electric wire 8 to which the light-emitting diodes 10 are to be mounted using a press or a roller, the areas of the portions on the electric wire 8 to be connected to the light-emitting diode 10 increase. Thus, the light-emitting diode 10 can be more readily mounted to the electric wire 8. The electric wire 8 can be an aggregate of a plurality of wire rods such as a twisted wire.

In a case where a circular wire is used, by using a plurality of thin circular wires as a single group (by using as a single electric wire), the light-emitting diode 10 can be readily mounted to the electric wire 8.

Forming a single group with three or more electric wires 8 (in particular, circular wires or the like) and using the single group as an electrode with one polarity (in other words, to use as though a single electric wire 8), the stability of the light-emitting diode 10 mounted on the electric wires 8 can be improved. Thus, the light-emitting diode 10 can be stably mounted on the electric wires 8. Specifically, by arranging a plurality of electric wires 8 parallel to each other on the substrate 4 at intervals that are shorter than a width of an electrode of the light-emitting diode 10 or by arranging the plurality of electric wires 8 parallel to each other on the substrate 4 so as to come in contact with each other, the plurality of electric wires 8 can be used as an electrode with one polarity.

Three or more electric wires 8 which are used as a single group can include an electric wire 8 that is not electrically connected to the light-emitting diode 10. For example, when using three electric wires 8 as a single group, the two electric wires 8 among the three electric wires 8 can be electrically connected to the light-emitting diode 10, and the one remaining electric wire 8 can be exclusively used to improve the stability of the light-emitting diode 10 without being electrically connected to the light-emitting diode 10.

A shape, dimensions, and the like of the electric wire 8 are not particularly limited. For example, depending on properties required for the light-emitting device, a size of the light-emitting diode 10 to be mounted, and the like, a thickness or a width of the electric wire 8 can range between several tenths of mm to several mm. For example, an electric wire 8 with a thickness ranging from 0.1 mm to 2 mm and a length ranging from 1 mm to 5 m can be used. However, since an enameled wire or the like has low reflectivity, generally, the enameled wire may become an absorption source of the light in the light-emitting device. Therefore, when using an enameled wire or the like as the electric wire 8, a diameter of the electric wire 8 is favorably narrower than the light-emitting diode 10 (favorably narrower than a positive electrode or a negative electrode of the light-emitting diode 10). In this way, the efficiency of a light-emitting device can be increased and the weight of the light-emitting device can be reduced. In addition, the material cost for the light-emitting device can be reduced.

When mounting the light-emitting diode 10 to the electric wire 8, an electrode of the light-emitting diode 10 is connected to an electrode provided on the electric wire 8. The electrode on the electric wire 8, for example, can be formed by the following methods.

Example of Forming an Electrode <Example 1>

Figure 9:
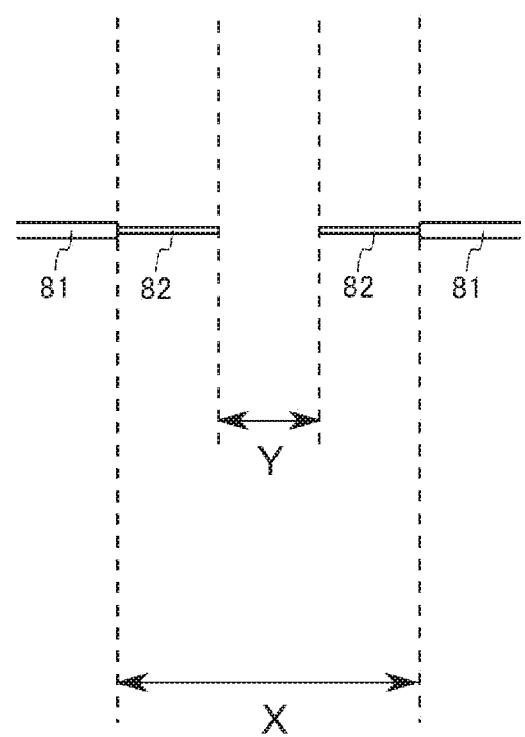
FIG. 9 is a schematic plan view showing an example (Example 1) of a method of forming electrodes on one or more electric wire 8.

FIG. 9 is a schematic plan view showing an example (Example 1) of a method of forming electrodes on one or more electric wire 8.

As shown in FIG. 9, this example uses a coated electric wire (circular wire) as the electric wire 8. When a coated electric wire (circular wire) is used as the electric wire 8, for example, a coating 81 (a region denoted by X in FIG. 9) of the coated electric wire is removed by a half-cut made by a cutting tool (for example, a dicer or a Leutor), and the portion where the coating 81 has been removed (a region denoted by Y in FIG. 9) is cut by a full-cut. A portion where the coating 81 has been removed, in other words, a core wire 82 which remains after the cut, becomes the electrode on the electric wire 8 which is connected to the electrode of the light-emitting diode 10.

Example of Forming an Electrode <Example 2>

Figure 10:
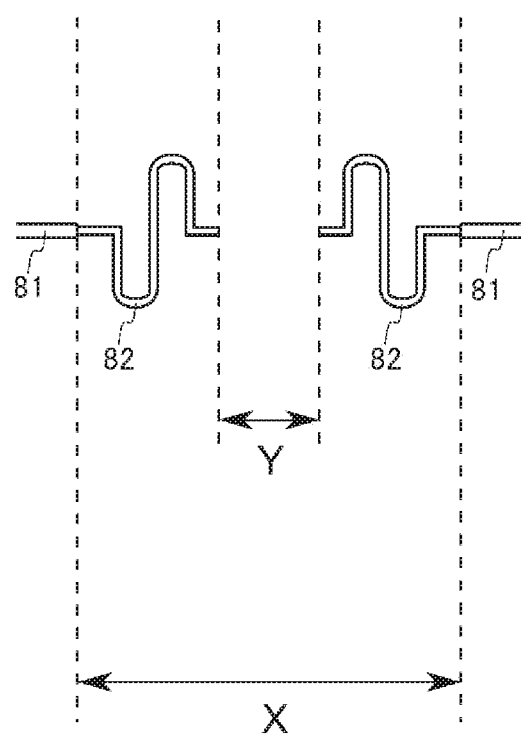
FIG. 10 is a schematic plan view showing an example (Example 2) of a method of forming electrodes on one or more electric wire 8.

FIG. 10 is a schematic plan view showing an example (Example 2) of a method of forming electrodes on one or more electric wire 8.

As shown in FIG. 10, in a similar manner to the example described above, this example also uses a coated electric wire (circular wire) as the electric wire 8. In this example, a portion where the coating has been removed, in other words, the core wire 82 which remains after the cut, is bent, and the bent portion becomes the electrode on the electric wire 8 which is connected to the electrode of the light-emitting diode 10. Bending the electric wire 8 in this manner increases the area of the electrode (the core wire 82 shown in FIGS. 9 and 10 from which the coating 81 has been removed) on the electric wire 8 which is connected to the electrode of the light-emitting diode 10. Therefore, for example, when the electric wire 8 is a fine wire or the like, the electrical contact between the light-emitting diode 10 and the electric wire 8 can be more easily secured.

In the examples (Examples 1 and 2) of a method of forming an electrode on the electric wire 8 described above, in addition to a method using a dicer, methods such as laser processing and punching can be used to cut the electric wire 8. By inserting a metal plate to be removed after processing between the electric wire 8 and the substrate 4 or by cutting the electric wire 8 on a processing stage and subsequently transferring the electric wire 8 to the substrate 4, the electric wire 8 can be cut without damaging the substrate 4.

Example of Forming an Electrode <Example 3>

Figure 11A:
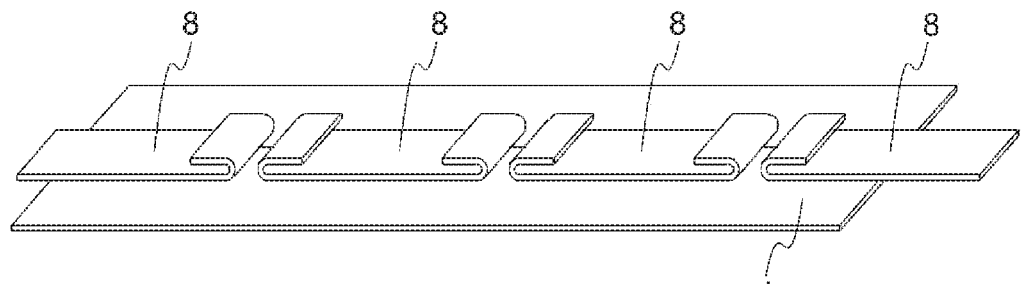
FIGS. 11A-11C are diagrams showing an example (Example 3) of a method of forming electrodes on one or more electric wire 8.
Figure 11B:
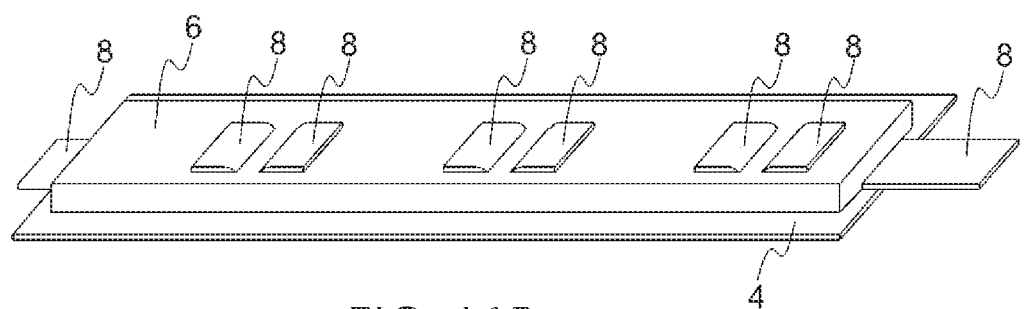
Figure 11C:
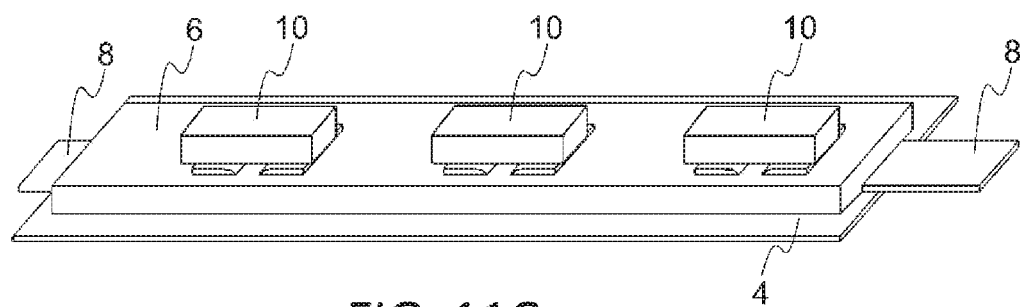

FIGS. 11A-11C are diagrams showing an example (Example 3) of a method of forming electrodes on one or more electric wire 8.

As shown in FIGS. 11A-11C, this example uses coated electric wires (rectangular wires) as the electric wire 8. When coated electric wires (rectangular wires) are used as the electric wires 8, for example, the ends of the coated electric wires are folded (FIG. 11A). An insulating layer 6 such as a white reflective material is provided on the substrate 4 so that the folded portions are exposed (FIG. 11B). The folded portions (the portions exposed from the insulating layer 6) become electrodes on the electric wire 8 which are connected to the electrodes of the light-emitting diodes 10 (FIG. 11C).

In other words, each of the electric wires 8 is folded (an example of bending), and it has a high portion (for example, a folded portion) and a low portion (for example, an unfolded portion) to provide a difference in height. The insulating layer 6 that is a white reflective material or the like is provided so that the high portion (for example, the folded portion) is exposed, and the high portion (for example, the folded portion) is used as the electrode on each of the electric wires 8 which is connected to the electrode of the light-emitting diode 10.

According to this example, by adjusting how much the electric wire 8 is to be folded, an area of the electric wire 8 which comes into contact with the electrode of the light-emitting diode 10 can be readily adjusted and an electrical contact between the light-emitting diode 10 and the electric wire 8 can be secured more readily.

Example of Forming an Electrode <Example 4>

Figure 12:
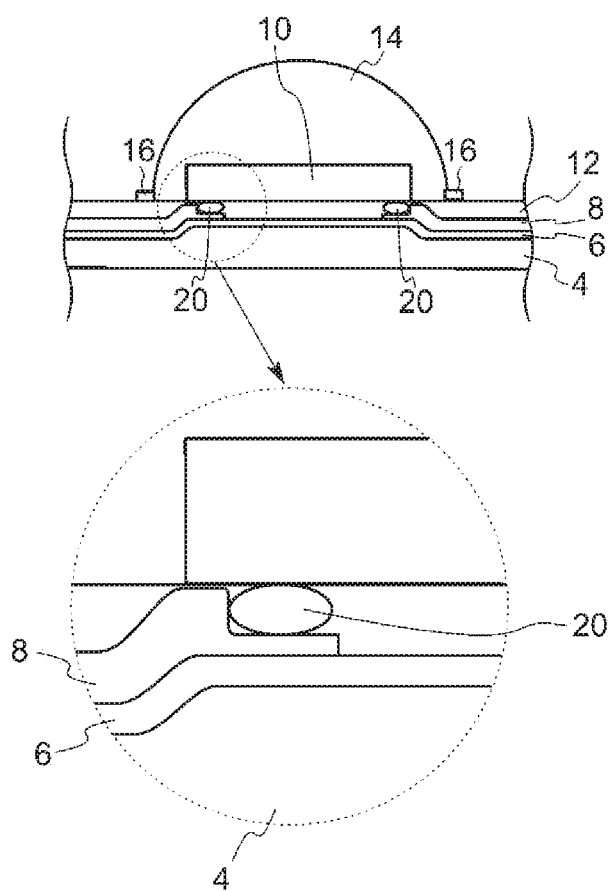
FIG. 12 is a diagram showing an example (Example 4) of a method of forming an electrode on one or more electric wire 8.

FIG. 12 is a diagram showing an example (Example 4) of a method of forming electrodes on one or more electric wire 8.

As shown in FIG. 12, in this example, a part of the substrate 4 is raised. A portion on the electric wire 8 that is fixed to the raised portion is used as the electrode and the light-emitting diode 10 is mounted thereto. In this way, since side surfaces of the light-emitting diode 10 can be prevented from being covered by connecting members 20 which connect the electrode of the light-emitting diode 10 and the electric wire 8 to each other or the like, the light can be emitted from the light-emitting device at high brightness.

Even when through holes 42 are provided on the substrate 4, favorably, respective portions of the electric wire 8 to which the light-emitting diodes 10 are to be mounted are bent (refer to FIGS. 6A-6C). In this way, since the area of the electric wire 8 that is brought into contact with the light-emitting diode increases, the light-emitting diode can be readily mounted to the electric wire 8.

[Short-Circuit Electric Wire 22]

The short-circuit electric wire 22 is used to short-circuit different electric wires 8. For example, when a power source is provided on the substrate 4, the short-circuit electric wire 22 is used to short-circuit an electric wire 8 connected to a positive electrode of the power source and an electric wire 8 connected to a positive electrode of the light-emitting diode 10, to short-circuit an electric wire 8 connected to a negative electrode of the power source and an electric wire 8 connected to a negative electrode of the light-emitting diode 10, to short-circuit electric wires 8 connected to positive electrodes of different substrates 4 or electric wires 8 connected to negative electrodes of different substrates 4, and the like. The use of the short-circuit electric wire 22 enables complicated circuits such as a series-parallel circuit (refer to FIG. 4) in which each branch of a plurality of parallel circuits includes a plurality of light-emitting diodes 10 connected in series and a parallel-series circuit (refer to FIG. 5) in which a plurality of parallel circuits having a plurality of light-emitting diodes 10 connected in parallel is connected in series to be readily constructed. Thus, desired light-emitting devices in which light-emitting diodes 10 are connected in various modes can be inexpensively provided.

A wire using the same material or having the same shape as the electric wire 8 can be used as the short-circuit electric wire 22. Examples of shapes that can be used include a U-shaped pin. Connection of the short-circuit electric wire 22 to the electric wire 8 can be performed using connecting members such as a solder material or by fusing.

[Light-Emitting Diode 10]

As the light-emitting diode 10, for example, various elements such as a surface mount LED, a lamp LED, an LED chip, and a chip-size packaged LED can be used. An LED chip in which a blue light-emitting GaN-based semiconductor is stacked on a translucent substrate such as a sapphire substrate or the like can be particularly favorably used as the light-emitting diode 10 by combining with a wavelength converting member such as a phosphor in a light-emitting device used as a lighting device. An inexpensive light-emitting device can be realized by using an unpackaged LED chip as the light-emitting diode 10.

The light-emitting diode 10 can be mounted to the electric wire 8 in various modes (for example, flip-chip mounting, mounting by wire bonding, and mounting which combines die bonding and wire bonding). In particular, by flip-chip mounting, since the light-emitting diode 10 can be placed on the substrate 4 and the light-emitting diode 10 and the electric wire 8 can be electrically connected to one another at the same time, mass productivity can be improved.

In addition to the front surface side of the substrate 4 and inside the through holes 42 of the substrate 4, the light-emitting diode 10 can also be provided on the rear surface side of the substrate 4.

[Adhesive 12]

The substrate 4 and the electric wire 8 can be adhered to each other by one or more adhesive 12. The electric wire 8 and the light-emitting diode 10 can be collectively adhered to the substrate 4 by the adhesive 12.

Favorably, the adhesive 12 has high transparency, high heat resistance and high light resistance, and has insulating property. Specifically, for example, transparent adhesives including an epoxy-based adhesive, a silicone-based adhesive, an acrylic adhesive, a modified silicone-based adhesive, and a urethane-based adhesive can be used. A thermosetting adhesive or an ultraviolet-curable adhesive can be used. In particular, an acrylic ultraviolet-curable adhesive is favorable due to superior heat resistance and superior light resistance, a high curing rate, and the ability to simplify production lines. When a member with flexibility is used as the substrate 4, favorably, a member with flexibility (for example, a resin) is also used as the adhesive 12. In this way, when the substrate 4 bends, the stress applied to the light-emitting diode 10 or the electric wire 8 can be reduced.

In addition, as the adhesive 12, a combination of a plurality of adhesives can be used. For example, a thermosetting adhesive can be used around the through holes 42 and a thermoplastic adhesive can be used in other portions.

Favorably, the adhesive 12 contains a filler to enable adjustment of optical reflectivity, viscosity, and the like. By containing a reflective material such as a white filler or a white powder made of $TiO_2$, $SiO_2$, or the like, the light emitted from the light-emitting diode 10 can be efficiently reflected on the substrate 4. As such fillers, oxides of Mg, Ca, Ba, Si, Al, Ti, Zr, rare-earth elements and mixtures thereof, and compounds thereof such as carbonates can be used. Fillers enable efficiency of the light-emitting device to be improved and shape control of the adhesive 12 to be performed in a favorable manner.

The adhesive 12 can be provided in a part of a junction between the substrate 4 and the electric wire 8 or can be provided on the entire junction. Providing the adhesive 12 in a part of a junction enables an inexpensive light-emitting device to be produced even if an expensive material (for example, a silicone resin) is used as the adhesive 12.

The adhesive 12 can be provided by methods such as dispensing and screen printing. When a light-emitting device is manufactured by a roll-to-roll process, the adhesive 12 is favorably provided by printing.

The adhesive 12 can be a tape. Examples of tapes to be used as the adhesive 12 include an epoxy film tape, a polyimide film tape, a PTFE film tape, a polyester film tape, an acetate cloth tape, a cotton cloth tape, and a vinyl tape.

[Sealing Member 14]

The light-emitting diode 10 can be sealed by a sealing member 14.

While various materials in accordance with the type of the light-emitting diode 10 can be used as the sealing member 14, a material with insulating property, high transparency, high heat resistance, and high light resistance is favorable. For example, while an epoxy-based resin, a silicone-based resin, a fluorine-based resin, or a resin that is a mixture thereof can be used, a silicone-based resin is preferably used. The sealing member 14 can be provided by various methods including potting, printing, and as a sheet.

The shape of the sealing member 14 is not limited. The sealing member 14 can be provided in a desired shape by controlling viscosity and thixotropy of the sealing member 14. In particular, by providing the sealing member 14 in a domed shape, the extraction efficiency of light of the light-emitting device can be improved.

The sealing member 14 can contain a wavelength converting member such as a phosphor. In this way, since various colors and emission spectra can be provided, the needs of a wide range of markets including general lighting and liquid crystal TVs (liquid crystal backlight) can be addressed.

Specifically, when the light-emitting diode 10 emits blue light, examples of the phosphor include a YAG phosphor that emits yellow light, a LAG phosphor or a SiAlON phosphor which emits green light, and a CASN phosphor or a SCASN phosphor which emits red light. By having the sealing member 14 contain these phosphors, a SiAlON phosphor that emits green light and a CASN phosphor which emits red light can be combined with the light-emitting diode 10 that emits blue light. In this way, a light-emitting device which has high color reproducibility and which is suitable as a light source for backlighting can be realized. By having the sealing member 14 contain a combination of a LAG phosphor or a YAG phosphor that emits green or yellow light and a red light-emitting phosphor, a light-emitting device which has higher color rendering property (Ra) than when using one phosphor and which is capable of emitting white light and light bulb-color light that are suitable as a light source for illumination can be realized.

The sealing member 14 can contain various fillers. The sealing member 14 can also contain a light-diffusing member that scatters light. In this way, a desired light distribution can be obtained or color unevenness can be prevented. Examples of a material of the light-diffusing member include $TiO_2$, $SiO_2$, $Al_2O_3$, MgO, $MgCO_3$, $CaCO_3$, $Mg(OH)_2$, and $Ca(OH)_2$.

The sealing member 14 can contain one or more kinds of filler. In this way, color unevenness of the light-emitting device can be prevented and the shape of the sealing member can be controlled. Examples of the fillers include inorganic fillers such as oxides of Mg, Ca, Ba, Si, Al, Ti, Zr, rare-earth elements and mixtures thereof, and carbonates and other compounds.

A method used to provide the sealing member 14 is not particularly limited. The sealing member 14 can be provided by various methods including molding using a casting case, potting on the light-emitting diode 10, printing, transfer molding, compression molding, and injection molding. Sealing by the sealing member 14 can be performed individually on each of the light-emitting diodes 10 (refer to FIGS. 1 to 8) or performed collectively on a plurality of the light-emitting diodes 10.

[Embankment Portion 16]

The sealing member 14 can be enclosed by an embankment portion 16. With the embankment portion 16, outflow or the like of the sealing member 14 can be prevented when sealing the light-emitting diode 10 with the sealing member 14, and the sealing member 14 can be readily formed.

For example, a member with high reflectivity is favorably used as the embankment portion 16. Specifically, for example, in the case of resins, a white resin with high heat resistance and high light resistance and containing a white filler such as $TiO_2$ or $SiO_2$ can be favorably used as the embankment portion 16. In the case of ceramics, a frame made of $Al_2O_3$ or $TiO_2$, an Al-deposited or Ag-deposited glass frame, or the like can be favorably used as the embankment portion 16.

A member with a large angle of contact with the sealing member 14 is favorably used as the embankment portion 16. In this way, a height of the sealing member 14 can be adjusted when forming the sealing member 14 and the light distribution of the light-emitting device can be controlled.

[Connecting Member 20]

As the connecting member 20 which connects the light-emitting diode 10 and the electric wire 8 to each other, a conductive joining material including solders such as Au—Sn, Sn—Cu—Ag, Sn—Cu, Sn—Bi, and Sn—Zn, anisotropic conductive pastes, silver pastes, copper pastes, and carbon pastes can be used.

However, when the light-emitting diode 10 and the electric wire 8 are connected to each other by flip-chip mounting as in the illustrated examples, bumps can be used as the connecting member in addition to the members described above. Au and an alloy thereof can be preferably used as the bumps.

When the light-emitting diode 10 and the electric wire 8 are connected to each other by wire bonding unlike in the illustrated examples, a wire can also be used as the connecting member. As the wire, a fine wire made of a metal such as Au, Ag, Al, and Cu, an alloy thereof, or a plated alloy can be preferably used. When the light-emitting diode 10 and the electric wire 8 are connected to each other by wire bonding, a portion where the light-emitting diode 10 is placed is not limited. In this case, for example, the light-emitting diode 10 can be placed on the substrate 4 at a portion separated from the electric wire 8 or between electric wires 8.

For example, an electrode of the light-emitting diode 10 and the electric wire 8 can be directly connected to each other without using a connecting member, by ultrasonic welding, fusing, or the like.

When the light-emitting diode 10 is bonded or adhered to the electric wire 8 without performing an electric connection, a thermosetting resin such as an epoxy resin or a silicone resin with insulating property can be used.

[Other]

Besides the above, a power-supply connector or a protective element (for example, a Zener diode) can also be provided on the electric wire 8 fixed on the substrate 4.

A position of the power-supply connector and a routing method of the electric wire 8 can be altered as appropriate depending on the intended use of the light-emitting device. For example, when the light-emitting device is used as a light source of a lighting device to replace a straight-tube fluorescent lamp, since a power-supply terminal must be provided at one end, favorably, the electric wire 8 is routed to the one end of the substrate 4 and positive and negative electrodes are provided at the one end.

As the Zener diode, a packaged Zener diode or the like can be used as well as a Zener diode chip.

Hereinafter, examples will be described.

First Example

An example of a method of manufacturing the light-emitting device shown in FIGS. 1A-1C will be described.

First, an aluminum plate (thickness 1 mm, width 16 mm, and length 706 mm) is prepared as the substrate 4.

Next, a PI film (thickness 38 μm) with insulating property is attached as the insulating layer 6 at an entire one surface of the substrate 4 or a portion of the one surface of the substrate 4 where the electric wire 8 is to be fixed on.

Next, a single copper-clad aluminum wire (φ 50 μm) subjected to an insulation coating process is linearly arranged as the electric wire 8 on the insulating layer 6 to be parallel to a longitudinal direction of the substrate 4. In doing so, the electric wire 8 is fitted in the groove 18 so as to be embedded halfway in the insulating layer 6.

Next, in order to have the substrate 4 and the electric wire 8 adhere to each other, the adhesives 12 made of a $TiO_2$-containing silicone resin are applied on the electric wire 8 and on 12 portions on the substrate 4 (specifically, on the insulating layer 6).

Each of the adhesives 12 applied on the substrate 4 has a circular shape with a diameter of 10 mm and with a center positioned on the electric wire 8. A center-to-center distance of the circles is set to 58 mm. Since the light outputted from the light-emitting diode 10 spreads in a circular shape, by applying the adhesives 12 so as to conform to the shape, the adhesives 12 can be prevented from being applied in a wasteful manner and a light-emitting device with improved light use efficiency can be inexpensively provided.

Next, by dispensing, $TiO_2$-containing silicone resin (white resin frame) with an annular (circular) shape that is 3 mm in diameter is formed as the embankment portions 16 in regions where the adhesives 12 have been applied. The circular regions where the adhesives 12 have been applied and the embankment portions 16 are concentrically arranged.

Next, the adhesives 12 and the embankment portions 16 are thermally hardened.

Next, near the center of a circular region where the each of adhesives 12 has been applied, the adhesives 12 are partially removed and the electric wire 8 is half-cut (at a cut width of 1 mm and to a depth that reaches the center of the electric wire 8) by a dicer to remove the insulation coating on the surface of the electric wire 8.

Next, the blade of the dicer is replaced to make a full-cut (cut width 0.1 mm, cut depth 0.06 mm) of the electric wire 8 whose insulation coating has been removed and whose core is exposed.

Next, solder pastes are dispensed as the connecting members 20 in portions of the electric wire 8 whose insulation coating has been removed and whose core is exposed.

Next, a plurality of LED chips (with a size of 1200 μm on a side in plan view) are mounted as the light-emitting diodes 10 by a mounter to a center portions of the regions where the adhesives 12 have been applied respectively, and each of the light-emitting diodes 10 are arranged at portions where the connecting members 20 are dispensed so that an electrode of the light-emitting diode 10 opposes the electric wire 8. A Zener diode and a connector are mounted to the electric wire 8.

Next, the connecting members 20 are melted by a reflow furnace to electrically connect the light-emitting diodes 10, the Zener diode, and the connector to the electric wire 8.

Next, the flux residue of the connecting members 20 is cleaned and removed.

Next, a transparent silicone-based resin with low viscosity and high light resistance is provided under each of the light-emitting diodes 10 as underfill.

Next, the sealing members 14 that is a translucent silicone resin containing a YAG phosphor is potted on each of the light-emitting diodes 10 and inside the embankment portions 16. In addition, a sealing member 14 is also potted on the Zener diode chip.

Next, the sealing members 14 are thermally hardened.

With the manufacturing method according to the first example, the light-emitting device shown in FIGS. 1A-1C can be inexpensively manufactured.

Second Example

Next, an example of a method of manufacturing the light-emitting device shown in FIGS. 2A-2C will be described.

First, a copper thin plate (thickness 0.3 mm, width 16 mm, and length 300 mm) is prepared as the substrate 4. Since a copper thin plate is used, the substrate 4 according to the second example has superior heat radiation.

Next, a white resist (thickness 38 μm) that is a $TiO_2$-containing silicone resin is printed on an entire one surface of the substrate 4 as the insulating layer 6.

Next, two copper wires (φ 200 μm) are linearly arranged on the insulating layer 6 as the electric wires 8 so as to be parallel to each other. In doing so, the electric wires 8 are fitted in the grooves 18 so as to be embedded halfway in the insulating layer 6. An interval between the two electric wires 8 is set to 0.2 mm.

Next, the adhesives 12 that are silicone resins including a white filler is applied on the electric wires 8 and the substrate 4 (more specifically, the insulating layer 6). The adhesives 12 applied on the substrate 4 have a circular shape with a diameter of 5 mm and with a center positioned between the two electric wires 8. A distance of the circles is set to 12 mm. As described earlier, since the light outputted from the light-emitting diode 10 spreads in a circular shape, by applying the adhesive 12 so as to conform to the shape, the adhesives 12 can be prevented from being applied in a wasteful manner and a light-emitting device with improved light use efficiency can be inexpensively provided.

Next, annular white frames with circular shapes that are 3 mm in diameter are formed as the embankment portions 16 by a method such as printing and dispensing.

Next, the adhesives 12 and the embankment portions 16 are hardened.

Next, the adhesives 12 are partially removed and the electric wires 8 are half-cut (at a cut width of 1 mm and to a depth that reaches the center of the electric wires 8) by a dicer to remove the insulation coating of the electric wires 8.

Next, solder pastes are dispensed as the connecting members 20 in portions of the electric wires 8 whose insulation coating have been removed and whose cores are exposed.

Next, LED chips are mounted as the light-emitting diodes 10 by a mounter to center portions of the regions where the adhesives 12 have been applied, and the light-emitting diodes 10 are arranged at portions where the connecting members 20 are dispensed so that the electrodes of the light-emitting diodes 10 oppose the electric wires 8 via the connecting members 20. A Zener diode and a connector are mounted to the electric wires 8.

Next, the connecting members 20 are melted by a reflow furnace to electrically connect the light-emitting diodes 10, the Zener diode, and the connector to the electric wires 8.

Next, the flux residue of the connecting members 20 is cleaned and removed.

Next, the sealing members 14 containing a phosphor are potted on the light-emitting diodes 10.

Subsequently, the sealing members 14 are thermally hardened.

With the manufacturing method according to the second example, the light-emitting device shown in FIGS. 2A-2C can be inexpensively manufactured.

Third Example

Next, an example of a method of manufacturing the light-emitting device shown in FIGS. 3A-3C will be described.

First, an electrogalvanized steel plate (thickness 1 mm, width 16 mm, and length 300 mm) is prepared as the substrate 4.

Next, a PET film (thickness 38 μm) is attached to an almost entire one surface of the substrate 4 as the insulating layer 6.

Next, an enameled wire with a bonding layer (for example, a type 0 magnet wire with a size of 0.1 mm) is wound in a single layer around the surface of the substrate 4 as the electric wire 8 from one end to another end of the substrate 4 so that a plurality of portions parallel to one another appear on short-direction side surfaces of the substrate 4. In doing so, the electric wire 8 is fitted in the grooves 18 provided on the side surfaces of the substrate 4. A distance between the electric wires 8 is set to 29.33 mm.

Next, in order to fix the substrate 4 and the electric wire 8 to each other, the substrate 4 wounded with the electric wire 8 is heated at approximately 120 to 220 degrees. The heating is favorably performed under pressure to prevent the electric wire 8 from detaching from the substrate 4.

Next, the adhesives 12 that are silicone resins including a white filler is applied on the electric wire 8 and the substrate 4 (more specifically, the insulating layer 6). The adhesives 12 applied on the substrate 4 are first applied so as to cover the electric wire 8 in a short direction of the substrate 4 and subsequently applied so as to form circles having centers at centers of the substrate 4 in the short direction. As described earlier, since the light outputted from the light-emitting diode 10 spreads in a circular shape, by applying the adhesives 12 so as to conform to the shape, the adhesives 12 can be prevented from being applied in a wasteful manner and a light-emitting device with improved light use efficiency can be inexpensively provided.

Next, an annular embankment portions 16 are formed.

Next, the adhesives 12 and the embankment portions 16 are hardened.

Next, the adhesives 12 are partially removed at center portions of the embankment portions 16 and the electric wire 8 is half-cut (at a cut width of 1 mm and to a depth that reaches the center of the electric wires 8) by a dicer to remove the insulation coating of the electric wire 8. A winding start portion and a winding end portion of the electric wire 8 at ends of the substrate 4 are also half-cut by the dicer.

Next, the blade of the dicer is replaced to make a full-cut (cut width 0.1 mm, cut depth 0.11 mm) of the electric wire 8 whose insulation coating has been removed and whose core is exposed.

Next, solder pastes are dispensed as the connecting members 20 in portions of the electric wire 8 whose insulation coating have been removed and whose core are exposed.

Next, LED chips (1200 μm on a side) are mounted as the light-emitting diodes 10 by a mounter to center portions of the embankment portions 16, and the light-emitting diodes 10 are arranged in flip-chip mounting at portions where the connecting members 20 are dispensed so that the electrodes of the light-emitting diodes 10 oppose the electric wire 8 via the connecting members 20. Another electric wire 8 parallel to the winding start portion and a winding end portion of the electric wire 8 is provided at ends of the substrate 4 and a Zener diode and a substrate are mounted to the other electric wire 8.

Next, the connecting members are melted by a reflow furnace to electrically connect the light-emitting diode 10, the Zener diode, and the connector to the electric wires 8.

Next, the flux residue of the connecting members 20 is cleaned and removed.

Next, the sealing members 14 containing a phosphor are potted on the light-emitting diodes 10. The sealing member 14 is also potted on the Zener diode.

Next, the sealing members 14 are hardened.

With the manufacturing method according to the third example, the light-emitting device shown in FIGS. 3A-3C can be inexpensively manufactured.

Fourth Example

Next, an example of a method of manufacturing the light-emitting device shown in FIG. 4 will be described.

First, PI film (thickness 0.38 mm, width 16 mm, and length 706 mm) are prepared as the substrates 4. As described earlier, since the insulating layers 6 are provided on the surfaces of the substrates 4, the substrates 4 do not appear in FIG. 4.

Next, white resists that are a $TiO_2$-containing silicone resin are printed on an approximately entire one surfaces of the substrate 4 as the insulating layers 6.

Next, three enameled wires (φ 50 μm) are linearly arranged on the insulating layers 6 as the electric wires 8 so as to be parallel to each other. The electric wires 8 are fixed on the substrates 4 with insulating tapes. Intervals between the three electric wires 8 are set to 1 mm.

Next, by printing, white annular frames that are shaped as circles with diameters of 3 mm are formed on the three electric wires 8 as the embankment portions 16. In doing so, the embankment portions 16 are formed so that centers of the circles of the embankment portions 16 are positioned above the center electric wires 8 among the three electric wires 8.

Next, the embankment portions 16 are hardened.

Next, the electric wires 8 are half-cut (at a cut width of 1 mm and to a depth that reaches the center of the electric wires 8) by a dicer to remove the insulation coating of the electric wires 8. Parallel electric wires 8 formed at ends of the substrates 4 are also half-cut by the dicer.

Next, the blade of the dicer is replaced to make a full-cut (cut width 0.1 mm, cut depth 0.06 mm) of the electric wires 8 whose insulation coating has been removed and whose core is exposed.

Next, solder pastes are dispensed as the connecting members in a portion of the electric wires 8 whose insulation coating have been removed and whose cores are exposed.

Next, LED chips are mounted as the light-emitting diode 10 by a mounter to a center portions of the embankment portions 16. Specifically, the light-emitting diodes 10 are arranged in portions where the connecting members are dispensed. A Zener diode and a connector are mounted to the electric wires 8. A short-circuit electric wires 22 are mounted to the electric wires 8 to form a series-parallel circuit in which each branch parallel circuit is made up of six light-emitting diodes 10 connected in series.

Next, the connecting members are melted by a reflow furnace to electrically connect the light-emitting diodes 10, the Zener diode, the connector, and the short-circuit electric wires 22 to the electric wires 8.

Next, the flux residue of the connecting member is cleaned and removed.

Next, the sealing members 14 containing a phosphor are potted on the light-emitting diodes 10. The sealing member 14 is also potted on the Zener diode.

Next, the sealing members 14 are thermally hardened.

With the manufacturing method according to the fourth example, the light-emitting device shown in FIG. 4 can be inexpensively manufactured. In particular, with the manufacturing method according to the fourth example, a plurality of the light-emitting diodes 10 can be inexpensively connected in series-parallel using the short-circuit electric wire 22. Accordingly, a light-emitting device with a complicated circuit configuration can be inexpensively formed.

Fifth Example

Next, an example of a method of manufacturing the light-emitting device shown in FIG. 5 will be described.

First, a piece of aluminum foil (thickness 0.1 mm, width 30 mm, and length 1200 mm) is prepared as the substrate 4. As described earlier, since the insulating layer 6 is provided on the surface of the substrate 4, the substrate 4 does not appear in FIG. 5.

Next, the insulating layer 6 (thickness 20 μm) is formed on an entire one surface of the substrate 4 by an alumite treatment and sealing.

Next, after applying adhesives on surfaces of three tin-plated aluminum wires (φ 100 μm), each of the tin-plated aluminum wires are linearly provided on the insulating layer 6 as the electric wires 8 so as to be parallel to a longitudinal direction of the substrate 4. Intervals between the three electric wires 8 are set to 1 mm.

Next, adhesives containing a white filler are applied to the insulating layer 6 on the substrate 4. The applied adhesives have circular shapes with diameters of 10 mm and with centers positioned on the electric wires 8. A center-to-center distance of the circles is set to 58 mm. As described earlier, since the light outputted from the light-emitting diode 10 spreads in a circular shape, by applying the adhesives so as to conform to the shape, the adhesives can be prevented from being applied in a wasteful manner and a light-emitting device with improved light use efficiency can be inexpensively provided.

Next, annular white frames with circular shapes that are 3 mm in diameter are formed as the embankment portions 16 by a method such as printing or dispensing in a region where the adhesives have been applied. The circular regions where the adhesives have been applied and the embankment portions 16 are concentrically arranged.

Next, the adhesives and the embankment portions 16 are hardened.

Next, the adhesives are partially removed at center portions of the regions where the adhesives have been applied to expose the electric wires 8. The adhesives are also removed from portions of electric wires 8 formed parallel at ends of the substrate 4 to expose the electric wires 8.

Next, a full-cut (cut width 0.1 mm, cut depth 0.11 mm) of the exposed electric wires 8 whose insulation coating have been removed is made by a dicer. Subsequently, a full-cut (cut width 1 mm, cut depth 0.11 mm) of predetermined portion of the center electric wire 8 among the three electric wires 8 is made.

Next, solder pastes are dispensed as the connecting members in portions of the exposed electric wires 8 whose insulation coating have been removed.

Next, LED chips (1200×500 μm) are mounted as the light-emitting diodes 10 by a mounter to center portions of the regions where the adhesives have been applied, and the light-emitting diodes 10 are arranged at portions where the connecting members have been dispensed so that electrodes of the light-emitting diode 10 oppose the electric wires 8. A Zener diode and a connector are mounted to the electric wires 8. The short-circuit electric wires 22 are mounted to the electric wires 8 to form a parallel-series circuit in which parallel circuits constituted by four light-emitting diodes 10 connected in parallel are connected in series.

Next, the connecting members are melted by a reflow furnace to connect the light-emitting diodes 10, the Zener diode, the connector, and the short-circuit electric wire 22 to the electric wires 8.

Next, the flux residue of the connecting members is cleaned and removed.

Next, the sealing members 14 containing a phosphor are potted on the light-emitting diodes 10. The sealing members 14 are also potted on the Zener diode.

Next, the sealing members 14 are hardened.

With the manufacturing method according to the fifth example, the light-emitting device shown in FIG. 5 can be inexpensively manufactured. In particular, with the manufacturing method according to the fifth example, a plurality of the light-emitting diodes 10 can be inexpensively connected in parallel-series using the short-circuit electric wires 22. Accordingly, a light-emitting device with a complicated circuit configuration can be inexpensively formed.

Sixth Example

Next, an example of a method of manufacturing the light-emitting device shown in FIGS. 6A-6C will be described with reference to FIGS. 13A-13E. FIGS. 13A-13E are partially enlarged views of a light-emitting device showing a method of manufacturing a light-emitting device according to a sixth example. As shown in FIGS. 13A-13E, the method of manufacturing a light-emitting device according to the sixth example includes the following steps.

(First Step)

Figure 13A:
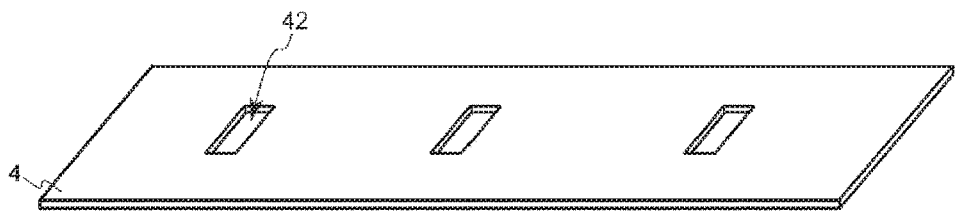
FIGS. 13A-13E are partially enlarged views of a light-emitting device showing a method of manufacturing a light-emitting device according to a sixth example.

First, as shown in FIG. 13A, a substrate 4 with a plurality of through holes 42 is prepared. An SUS304 thin plate with a thickness of 0.1 mm, a width of 16 mm, and a length of 300 mm is used as the substrate 4. Elongate holes (length 1 mm, width 0.4 mm) are formed at intervals of 12.5 mm at 24 portions on a center line of the substrate 4 to constitute the through holes 42.

(Second Step)

Figure 13B:
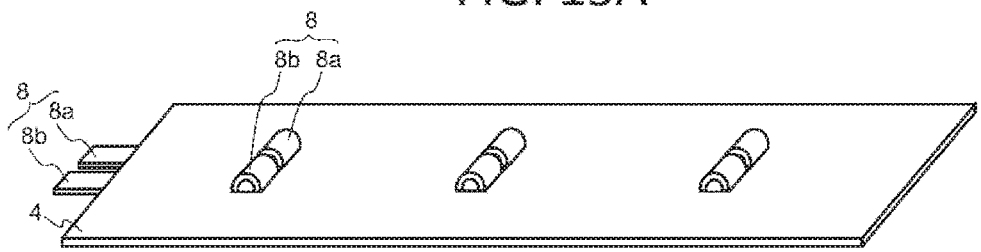

Next, as shown in FIG. 13B, the electric wires 8 made up of a pair of an anode electric wire 8a and a cathode electric wire 8b are provided on a rear surface side of the substrate 4. In doing so, with the anode electric wire 8a and the cathode electric wire 8b, respective portions to which the plurality of light-emitting diodes 10 are mounted are bent so as to project to a front surface side of the substrate 4 from a rear surface side of the substrate 4 through the through holes 42 and then again pass through the through holes 42 to return to the rear surface side of the substrate 4.

More specifically, on the rear surface side of the substrate 4, two enameled wires (rectangular wires; thickness 0.15 mm, width 0.5 mm) are laid as a pair of electric wires 8 so as to sandwich a center line of the substrate 4 and passed through the through holes 42 to project from the front surface side of the substrate 4 by 0.15 mm. Subsequently, an epoxy-based adhesives are applied as adhesives to a region surrounding the through holes 42 of the substrate 4 to fix the two electric wires 8 to the substrate 4.

(Third Step)

Figure 13C:
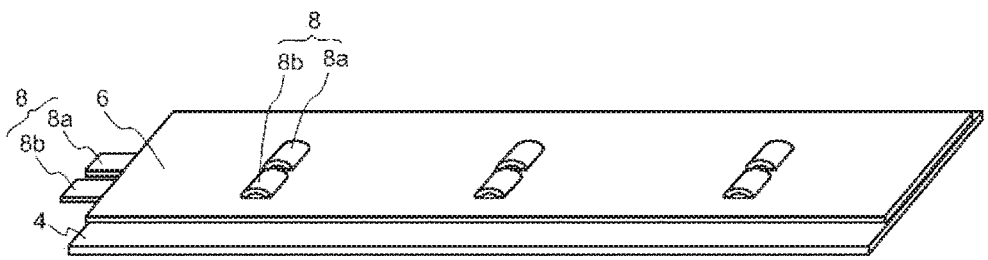

Next, as shown in FIG. 13C, a silicone-based white resist is provided at a thickness of 10 to 20 μm as the insulating layer 6 on the front surface side of the substrate 4. Various application methods such as screen printing and spray coating can be used.

Subsequently, an insulation coating (white resist and enamel) of portions (width 0.5 mm, length approximately 0.3 mm) of the pair of electric wires 8 projected from the through holes 42 are removed by, for example, a Leutor. In the sixth example, since the application thickness is thinner than a projected amount of the electric wires 8, the portions where the insulation coating is to be removed can be readily identified even after the insulating layer 6 is provided.

(Fourth Step)

Figure 13D:
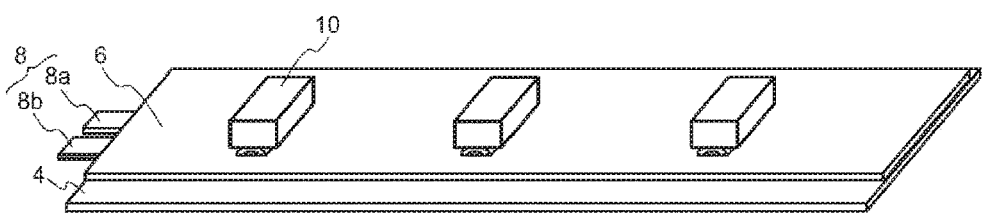

Next, as shown in FIG. 13D, solder pastes are dispensed as connecting members at the portions where the insulation coating have been removed (48 portions), and 24 flip-chip mounting LED chips (length 0.8 mm, width 0.3 mm) are mounted in a predetermined orientation (an orientation which enables positive and negative electrodes to be respectively connected to one electric wire 8 and the other electric wire 8 among the pair of electric wires 8) as the light-emitting diodes 10 at the portions where the connecting members have been dispensed. The connecting members are melted by a reflow furnace to connect the light-emitting diodes 10 to the electric wires 8.

A protective element such as a Zener diode, a connector, and the like are provided on the electric wires 8 on the rear surface side of the substrate 4.

(Fifth Step)

Figure 13E:
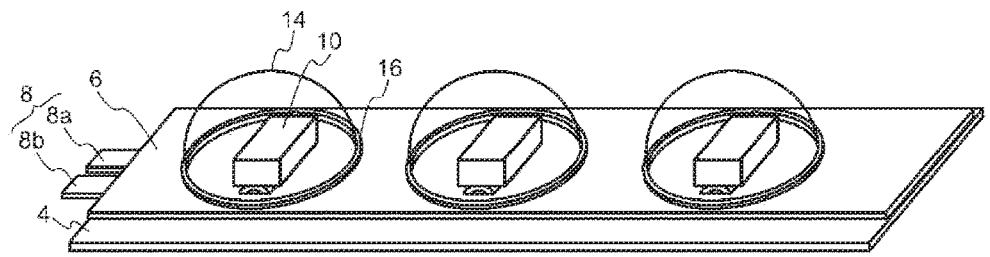

Next, as shown in FIG. 13E, flux is cleaned, an embankment portions 16 are formed using an epoxy-based transparent resin containing a white filler, and a silicone-based resin mixed with a YAG phosphor are potted and hardened as the sealing members 14.

Seventh Example

Next, an example of a method of manufacturing the light-emitting device shown in FIGS. 7A-7C will be described with reference to FIGS. 14A-14E. FIGS. 14A-14E are a partially enlarged views of a light-emitting device showing a method of manufacturing a light-emitting device according to a seventh example. As shown in FIGS. 14A-14E, the method of manufacturing a light-emitting device according to the seventh example includes the following steps.

(First Step)

Figure 14A:
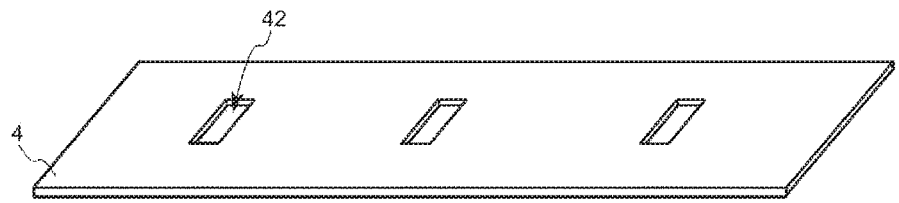
FIGS. 14A-14E are partially enlarged views of a light-emitting device showing a method of manufacturing a light-emitting device according to a seventh example.

First, as shown in FIG. 14A, a substrate 4 with a plurality of through holes 42 is prepared. An SUS304 thin plate with a thickness of 0.1 mm, a width of 16 mm, and a length of 300 mm is used as the substrate 4. Elongate holes (length 1 mm, width 0.4 mm) are formed at intervals of 12.5 mm at 24 portions on a center line of the substrate 4 to constitute the through holes 42.

(Second Step)

Figure 14B:
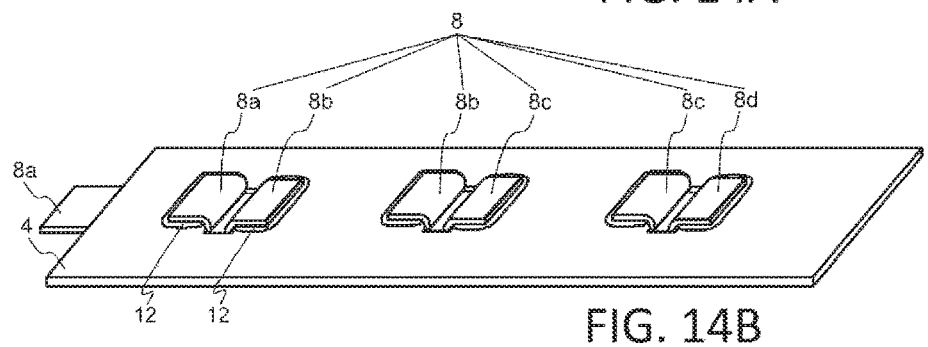

Next, as shown in FIG. 14B, on the rear surface side of the substrate 4, a single enameled wire (a rectangular wire; thickness 0.15 mm, width 0.5 mm) is laid over a center line of the substrate 4 and passed through the through holes 42 to project from the front surface side of the substrate 4 by 0.15 mm, and the projected portion is cut off. In this way, the single enameled wire is separated into a plurality of electric wires 8 (an electric wire 8a, an electric wire 8b, an electric wire 8c, an electric wire 8d, . . . ), and one end of each electric wire 8 (the electric wire 8a, the electric wire 8b, the electric wire 8c, the electric wire 8d, . . . ) and another end of each electric wire 8 (the electric wire 8a, the electric wire 8b, the electric wire 8c, the electric wire 8d, . . . ) are passed from the rear surface side of the substrate 4 through the through holes 42 to project from the front surface side of the substrate 4.

Subsequently, the projected one end and another end of each electric wires 8 (the electric wire 8a, the electric wire 8b, the electric wire 8c, the electric wire 8d, . . . ) are folded toward the front surface side of the substrate 4, an epoxy-based adhesives are applied as the adhesives 12 in a region surrounding the through holes 42 of the substrate 4, and the one end and the another end of each electric wire 8 (the electric wire 8a, the electric wire 8b, the electric wire 8c, the electric wire 8d, . . . ) are fixed to the substrate 4.

(Third Step)

Figure 14C:
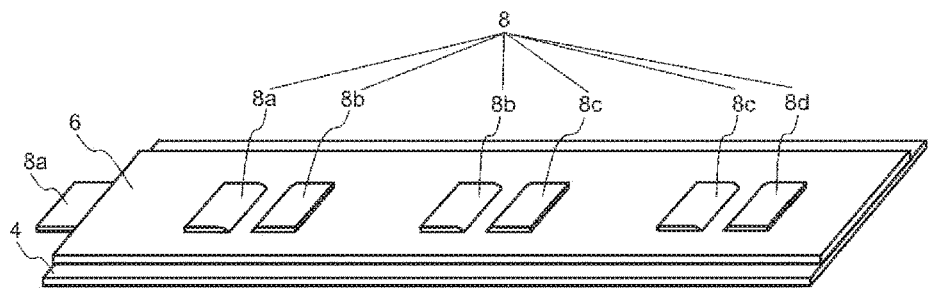

Next, as shown in FIG. 14C, a silicone-based white resist is provided at a thickness of 10 to 20 μm as the insulating layer 6 on the front surface side of the substrate 4 and then hardened.

Subsequently, an insulation coating (white resist and enamel) of a portion (width 0.5 mm, length approximately 0.3 mm) of the one end and the another end of each electric wire 8 (the electric wire 8a, the electric wire 8b, the electric wire 8c, the electric wire 8d, . . . ) that are projected from the through holes 42 is removed by a blade such as a Leutor. In the seventh example, in a similar manner to the sixth example, since the application thickness of the insulating layer 6 is thinner than a projected amount of the electric wires 8, portions where the insulation coating is to be removed can be readily identified even after application.

(Fourth Step)

Figure 14D:
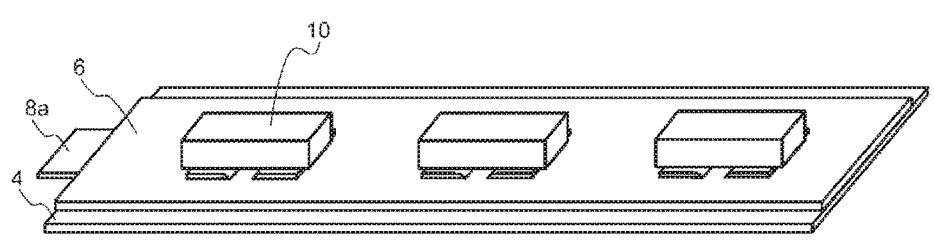

Next, as shown in FIG. 14D, solder pastes are dispensed as connecting members at the portions where the insulation coating have been removed (48 portions), and 24 flip-chip mounting LED chips (length 0.8 mm, width 0.3 mm) are mounted in a predetermined orientation (an orientation which enables positive and negative electrodes to be respectively connected to one end of one electric wire 8 (for example, the electric wire 8a) and another end of another electric wire 8 (for example, the electric wire 8b)) as the light-emitting diodes 10 at the portions where the connecting members have been dispensed. The connecting members are melted by a reflow furnace to electrically connect the light-emitting diodes 10 to the electric wires 8.

A protective element such as a Zener diode, a connector, and the like are provided on the electric wires 8 on the rear surface side of the substrate 4.

(Fifth Step)

Figure 14E:
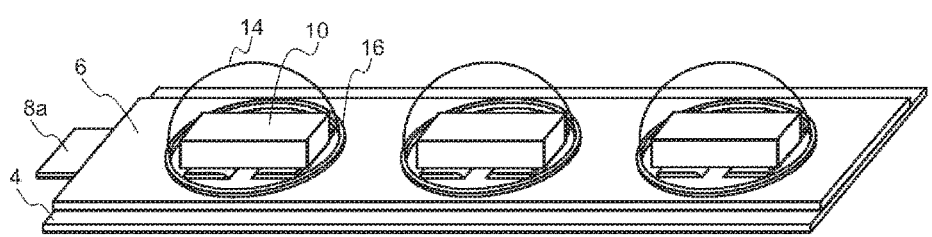

Next, as shown in FIG. 14E, flux is cleaned, a annular (circular) embankment portions 16 which enclose the light-emitting diodes 10 in plan view are formed using an epoxy-based transparent resin containing a white filler, and a silicone-based resins mixed with a YAG phosphor are potted and hardened as the sealing members 14 on the inside of the embankment portion 16.

Eighth Example

Next, an example of a method of manufacturing the light-emitting device shown in FIGS. 8A-8C will be described with reference to FIGS. 15A-15D. FIGS. 15A-15D are a partially enlarged view of a light-emitting device showing a method of manufacturing a light-emitting device according to an eighth example. As shown in FIGS. 15A-15D, the method of manufacturing a light-emitting device according to the eighth example includes the following steps.

(First Step)

Figure 15A:
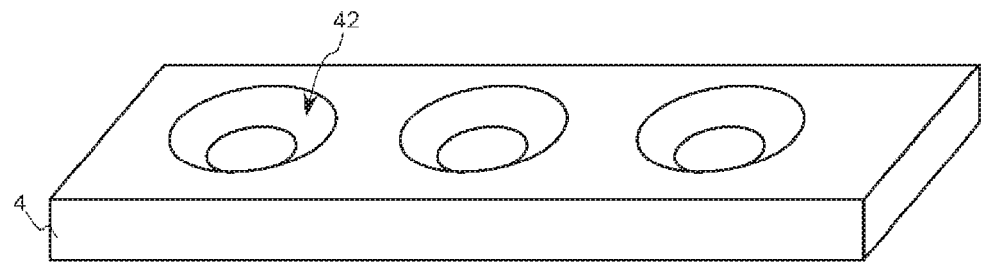
FIGS. 15A-15D are partially enlarged views of a light-emitting device showing a method of manufacturing a light-emitting device according to an eighth example.

First, as shown in FIG. 15A, a substrate 4 with a plurality of through holes 42 is prepared. A white polyphthalamide (PPA) plate with a thickness of 2 mm, a width of 16 mm, and a length of 300 mm is used as the substrate 4. Holes (with an upper surface diameter of 3 mm and a bottom surface diameter of 1.4 mm) that are circular in plan view are formed at 12.5 mm intervals at 24 portions on a center line of the substrate 4 to constitute the through holes 42.

(Second Step)

Figure 15B:
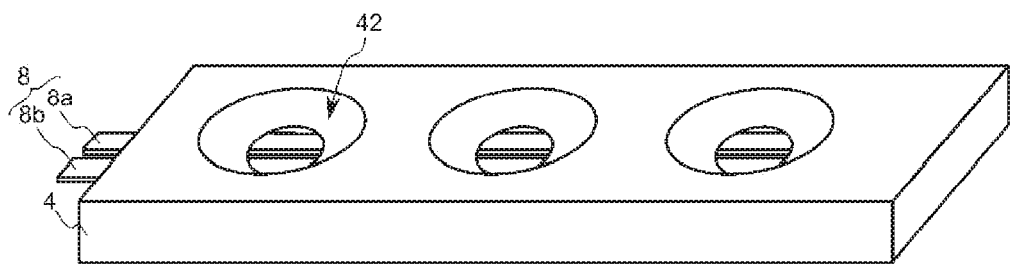

Next, as shown in FIG. 15B, electric wires 8 made up of a pair of an anode electric wire 8a and a cathode electric wire 8b are provided on a rear surface side of the substrate 4. In doing so, the anode electric wire 8a and the cathode electric wire 8b are provided so as to traverse opening planes of the through holes 42 on a rear surface side of the substrate 4.

More specifically, on the rear surface side of the substrate 4, two enameled wires (rectangular wires; thickness 0.15 mm, width 0.5 mm) are laid as a pair of electric wires 8 so as to sandwich a center line of the substrate 4 and to traverse opening planes of the through holes 42. An epoxy-based adhesives are applied as the adhesives to the substrate 4 to fix the two electric wires 8 to the substrate 4.

(Third Step)

Figure 15C:
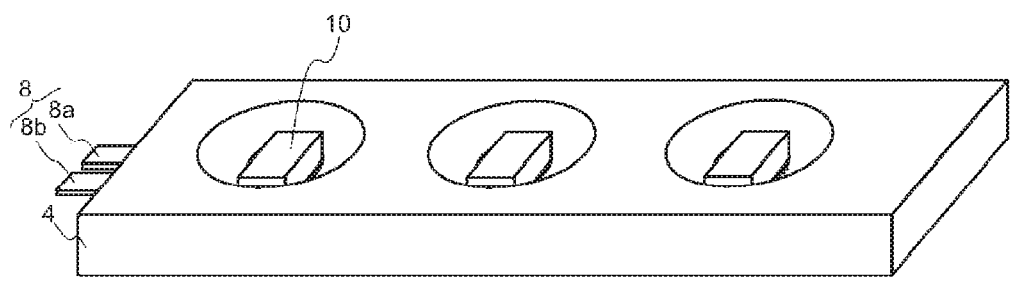

Next, as shown in FIG. 15C, an insulation coating (enamel) of a portion (width 0.5 mm, length approximately 0.3 mm) of the pair of electric wires 8 above the opening planes of the through holes 42 is removed by, for example, a Leutor. As shown in FIG. 15C, solder pastes are dispensed as connecting members at the portions where the insulation coating have been removed, and LED chips (length 0.8 mm, width 0.3 mm) having positive and negative electrodes formed on one primary surface are mounted in a predetermined orientation (an orientation which enables the positive and negative electrodes to be respectively connected to one electric wire 8 and the other electric wire 8) as the light-emitting diodes 10 at the portions where the connecting members have been dispensed. The connecting members are melted by a reflow furnace to connect the light-emitting diodes 10 to the electric wires 8.

A protective element such as a Zener diode, a connector, and the like are provided on the electric wires 8 on the rear surface side of the substrate 4.

(Fourth Step)

Figure 15D:
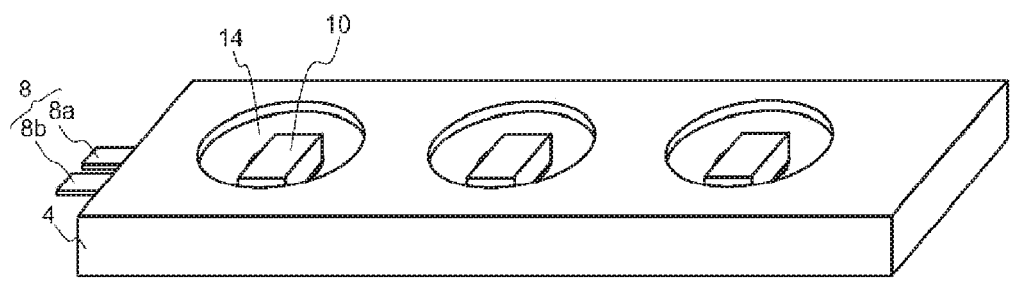

Next, as shown in FIG. 15D, after flux is cleaned, a silicone-based resins mixed with a YAG phosphor are potted and hardened as the sealing members 14.

While rectangular wires are used as the electric wires 8 in the sixth, seventh, and eighth examples described above, circular wires can also be used. In this case, a lock stitch of a sewing machine which uses an upper thread and a lower thread can be applied so that the electric wire 8 is passed through the through holes of the substrate 4, and by adjusting tension and sizes of an upper thread and a lower thread (enameled wires), the electric wire 8 can be projected from the through holes 42 of the substrate 4 by a predetermined dimension. Specifically, the tension of the upper thread is set higher than that of the lower thread so that an end of the electric wire 8 that is the lower thread is projected from the substrate 4. At this point, by selecting a size and tension of the upper thread, a length by which the lower thread projects from the substrate 4 can be adjusted.

While embodiments and examples have been described above, it is to be understood that the descriptions merely present examples and are not to be construed as limiting the present invention in any way.

What is claimed is:

1. A method of manufacturing a light-emitting device, the method comprising steps of:
    providing a substrate having a rear surface side, a front surface side, and a plurality of through holes including a first through hole and a second through hole;
    providing an anode electric wire and a cathode electric wire;
    providing a plurality of light-emitting diodes including a first light-emitting diode and a second light-emitting diode, each light-emitting diode comprising a positive electrode and a negative electrode;
    configuring the anode electrode wire to include:
        a first anode connection portion that is bent so as to project to the front surface side of the substrate from the rear surface side of the substrate through the first through hole and then again pass through the first through hole to return to the rear surface side of the substrate, and
        a second anode connection portion that is bent so as to project to the front surface side of the substrate from the rear surface side of the substrate through the second through hole and then again pass through the second through hole to return to the rear surface side of the substrate;

configuring the cathode electrode wire to include:
  a first cathode connection portion that is bent so as to project to the front surface side of the substrate from the rear surface side of the substrate through the first through hole and then again pass through the first through hole to return to the rear surface side of the substrate, and
  a second cathode connection portion that is bent so as to project to the front surface side of the substrate from the rear surface side of the substrate through the second through hole and then again pass through the second through hole to return to the rear surface side of the substrate;
mounting the first light-emitting diode to the first anode connection portion and the first cathode connection portion, such that the positive electrode of the first light-emitting diode is connected to the anode electrode wire, and the negative electrode of the first light-emitting diode is connected to the cathode electrode wire; and
mounting the second light-emitting diode to the second anode connection portion and the second cathode connection portion, such that the positive electrode of the second light-emitting diode is connected to the anode electrode wire, and the negative electrode of the second light-emitting diode is connected to the cathode electrode wire.

2. The method of manufacturing a light-emitting device according to claim 1, further comprising, after the mounting step, sealing the plurality of light-emitting diodes.

3. The method of manufacturing a light-emitting device according to claim 1, wherein each of the plurality of light-emitting diodes is an LED chip.

4. A method of manufacturing a light-emitting device, the method comprising steps of:
  providing a substrate having a rear surface side, a front surface side, and a plurality of through holes;
  providing a plurality of electric wires including a first electric wire and a second electric wire;
  providing a plurality of light-emitting diodes including a first light-emitting diode, each light-emitting diode comprising a positive electrode and a negative electrode;
  configuring the first electric wire to include a first connection portion on a first side of the first electric wire and a second connection portion on a second side of the first electric wire, the first and second connection portions of the first electric wire extending through the through holes from the rear surface side of the substrate to the front surface side of the substrate, and then extending inwards towards each other such that an end face of the first connection portion faces an end face of the second connection portion;
  configuring the second electric wire to include a first connection portion on a first side of the second electric wire and a second connection portion on a second side of the second electric wire, the first and second connection portions of the second electric wire extending through the through holes from the rear surface side of the substrate to the front surface side of the substrate, and then extending inwards towards each other such that an end face of the first connection portion faces an end face of the second connection portion; and
  mounting the first light-emitting diode to the second connection portion of the first electric wire and to the first connection portion of the second electric wire, such that the positive electrode of the first light-emitting diode is connected to the first electric wire, and the negative electrode of the first light-emitting diode is connected to the second electric wire.

5. The method of manufacturing a light-emitting device according to claim 4, wherein first and second electric wires are configured by folding the first and second electric wires.

6. A method of manufacturing a light-emitting device, the method comprising steps of:
  providing a substrate having a rear surface side, a front surface side, and a plurality of through holes including a first through hole and a second through hole;
  providing an anode electric wire and a cathode electric wire;
  providing a plurality of light-emitting diodes including a first light-emitting diode and a second light-emitting diode, each light-emitting diode comprising a positive electrode and a negative electrode;
  configuring the anode electric wire such that the anode electric wire extends along the rear surface side of the substrate past the first through hole and the second through hole, and such that the anode electric wire includes a first anode connection portion exposed at a bottom of the first through hole and a second anode connection portion exposed at a bottom of the second through hole;
  configuring the cathode electric wire such that the cathode electric wire extends along the rear surface side of the substrate past the first through hole and the second through hole, and such that the cathode electric wire includes a first cathode connection portion exposed at a bottom of the first through hole and a second cathode connection portion exposed at a bottom of the second through hole;
  locating the first light-emitting diode in the first through hole such that the positive electrode of the first light-emitting diode is connected to the first anode connection portion of the anode electric wire, and the negative electrode of the first light-emitting diode is connected to the first cathode connection portion of the cathode electric wire; and
  locating the second light-emitting diode in the second through hole such that the positive electrode of the second light-emitting diode is connected to the second anode connection portion of the anode electric wire, and the negative electrode of the second light-emitting diode is connected to the second cathode connection portion of the cathode electric wire.

7. The method of manufacturing a light-emitting device according to claim 1 further comprising a step of mounting another light-emitting diode from the plurality of light-emitting diodes, a protective element, or a combination thereof to the anode electric wire and a cathode electric wire on the rear surface side of the substrate.

* * * * *